(12) United States Patent
Chen et al.

(10) Patent No.: US 11,476,158 B2
(45) Date of Patent: Oct. 18, 2022

(54) COBALT DEPOSITION SELECTIVITY ON COPPER AND DIELECTRICS

(71) Applicant: Entegris, Inc., Billerica, MA (US)

(72) Inventors: Philip S. H. Chen, Bethel, CT (US);
William Hunks, Waterbury, CT (US);
Steven Lippy, Brookfield, CT (US);
Ruben Remco Lieten, Leuven (BE)

(73) Assignee: ENTEGRIS, INC., Billerica, MA (US)

( * ) Notice: Subject to any disclaimer, the term of this patent is extended or adjusted under 35 U.S.C. 154(b) by 881 days.

(21) Appl. No.: 15/510,732

(22) PCT Filed: Sep. 3, 2015

(86) PCT No.: PCT/US2015/048216
§ 371 (c)(1),
(2) Date: Nov. 16, 2018

(87) PCT Pub. No.: WO2016/040077
PCT Pub. Date: Mar. 17, 2016

(65) Prior Publication Data
US 2018/0130706 A1    May 10, 2018

Related U.S. Application Data

(60) Provisional application No. 62/050,166, filed on Sep. 14, 2014, provisional application No. 62/107,273, filed on Jan. 23, 2015, provisional application No. 62/110,078, filed on Jan. 30, 2015.

(51) Int. Cl.
| | | |
|---|---|---|
| *C23C 16/02* | (2006.01) | |
| *H01L 21/768* | (2006.01) | |
| *H01L 21/285* | (2006.01) | |
| *H01L 21/02* | (2006.01) | |
| *C23C 16/56* | (2006.01) | |
| *C23C 16/04* | (2006.01) | |
| *C23C 16/18* | (2006.01) | |
| *H01L 21/3213* | (2006.01) | |
| *C23C 16/06* | (2006.01) | |
| *C23C 16/455* | (2006.01) | |
| *H01L 23/532* | (2006.01) | |
| *H01L 21/311* | (2006.01) | |

(52) U.S. Cl.
CPC ........ *H01L 21/76879* (2013.01); *C23C 16/02* (2013.01); *C23C 16/0227* (2013.01); *C23C 16/04* (2013.01); *C23C 16/06* (2013.01); *C23C 16/18* (2013.01); *C23C 16/45525* (2013.01); *C23C 16/45559* (2013.01); *C23C 16/56* (2013.01); *H01L 21/02063* (2013.01); *H01L 21/28562* (2013.01); *H01L 21/32134* (2013.01); *H01L 21/76814* (2013.01); *H01L 21/76849* (2013.01); *H01L 21/76864* (2013.01); *H01L 21/76873* (2013.01); *H01L 23/53238* (2013.01); *H01L 21/31144* (2013.01); *H01L 23/53266* (2013.01)

(58) Field of Classification Search
CPC ......... C23C 16/02; C23C 16/04; C23C 16/06; C23C 16/18; C23C 16/45525; C23C 16/45529; C23C 16/56
See application file for complete search history.

(56) References Cited

U.S. PATENT DOCUMENTS

| | | | | |
|---|---|---|---|---|
| 6,527,855 | B2* | 3/2003 | DelaRosa | C23C 16/18 117/102 |
| 7,507,390 | B2* | 3/2009 | Choi | C23C 16/42 423/326 |
| 10,014,212 | B2* | 7/2018 | Chen | H01L 21/76826 |
| 2004/0224866 | A1 | 11/2004 | Matsunaga et al. | |
| 2004/0248405 | A1* | 12/2004 | Fukunaga | H01L 21/76877 438/637 |

(Continued)

FOREIGN PATENT DOCUMENTS

| | | | | |
|---|---|---|---|---|
| KR | 10-1719526 | * | 4/2017 | ............. C23C 16/18 |
| KR | 101719526 B1 | * | 4/2017 | |

(Continued)

OTHER PUBLICATIONS

Kaloyeros, Alain E., et al., "Review—Cobalt Thin Films: Trends in Processing Technologies and Emerging Applications". ECS Journal of Solid State Science and Technology, 8 (2) p. 119-p. 152 (2019).*
Knijnenburg, Quinten, et al., "The Electronic Structure of (Diiminopyridine)cobalt(I) Complexes". Eur. J. Inorg. Chem. 2004, 12041211, pp. 1204-1211. DOI: 10.1002/ejic.200300569 E.*
Pugh, Thomas, et al., "Cobalt(III) Diazabutadiene Precursors for Metal Deposition: Nanoparticle and Thin Film Growth". Inorganic Chemistry, 2013, 52, pp. 13719-13729. dx.doi.org/10.1021/ic402317g.*
Kerrigan, Marissa M., et al., "Low Temperature, Selective Atomic Layer Deposition of Cobalt Metal Films Using Bis(1,4-di-tert-butyl-1,3-diazadienyl)cobalt and Alkylamine Precursors", pp. 1-48. No date or citation information available.*
Lee, Han-Bo-Ram, et al., "Area Selective Atomic Layer Deposition of Cobalt Thin Films". 2008 ECS Trans. 16 (4) 219-225 (2008).*

(Continued)

*Primary Examiner* — Bret P Chen

(57) ABSTRACT

A process for forming cobalt on a substrate, comprising: volatilizing a cobalt precursor of the disclosure, to form, a precursor vapor: and contacting the precursor vapor with the substrate under vapor deposition conditions effective for depositing cobalt on the substrate from the precursor vapor, wherein the vapor deposition conditions include temperature not exceeding 200° C., wherein: the substrate includes copper surface and dielectric material, e.g., ultra-low dielectric material. Such cobalt deposition process can be used to manufacture product articles in which the deposited cobalt forms a capping layer, encapsulating layer, electrode, diffusion layer, or seed for electroplating of metal thereon, e.g., a semiconductor device, flat-panel, display, or solar panel. A cleaning composition containing base and oxidizing agent components may be employed to clean the copper prior to deposition of cobalt thereon, to achieve substantially reduced defects in the deposited cobalt.

16 Claims, 28 Drawing Sheets

(56) References Cited

U.S. PATENT DOCUMENTS

| | | | |
|---|---|---|---|
| 2005/0124158 A1* | 6/2005 | Lopatin | C23C 28/023 438/686 |
| 2006/0033678 A1* | 2/2006 | Lubomirsky | H01L 21/67745 345/32 |
| 2006/0084260 A1* | 4/2006 | Boyers | H01L 21/76838 438/618 |
| 2006/0237853 A1 | 10/2006 | Nogami | |
| 2007/0292615 A1* | 12/2007 | Dordi | C23C 18/1893 427/532 |
| 2009/0029186 A1* | 1/2009 | Matsunaga | C23C 28/00 428/607 |
| 2009/0269507 A1* | 10/2009 | Yu | H01L 21/2855 427/535 |
| 2009/0280649 A1* | 11/2009 | Mayer | H01L 21/7684 156/345.23 |
| 2010/0327339 A1* | 12/2010 | Tanaka | H01L 27/11573 257/324 |
| 2011/0086509 A1* | 4/2011 | Ganguli | C23C 16/18 438/655 |
| 2012/0276412 A1* | 11/2012 | Miki | C23C 28/345 205/152 |
| 2013/0164456 A1 | 6/2013 | Winter et al. | |
| 2013/0251903 A1* | 9/2013 | Han | C07F 15/045 427/252 |
| 2013/0260555 A1 | 10/2013 | Zope | |
| 2014/0349480 A1* | 11/2014 | Shek | H01L 21/76834 438/652 |
| 2015/0105573 A1 | 4/2015 | Romero | |
| 2016/0314980 A1* | 10/2016 | Han | H01B 1/08 |
| 2017/0032973 A1* | 2/2017 | Baum | H01L 21/28568 |
| 2019/0382430 A1* | 12/2019 | Cooper | C23C 16/4481 |
| 2020/0266056 A1* | 8/2020 | Park | C23C 16/45553 |

FOREIGN PATENT DOCUMENTS

| | | |
|---|---|---|
| TW | 200500458 A | 1/2005 |
| TW | 201409613 A | 3/2014 |
| WO | WO 2012/067439 A2 * | 5/2012 ............. C23C 16/18 |
| WO | 2013/101907 A1 | 7/2013 |
| WO | 2013/173743 A2 | 11/2013 |
| WO | 2016/040077 A1 | 3/2016 |

OTHER PUBLICATIONS

Wu, X.C., et al., "Spatially Selective Electroless Deposition of Cobalt on Oxide Surfaces Directed by Microcontact Printing of Dendrimers". Langmuir vol. 18, No. 12, 2002, pp. 4984-4988.*

Pugh, Thomas, et al., "Cobalt(III) Diazabutadiene Precursors for Metal Deposition: Nanoparticle and Thin Film Growth". Inorganic Chemistry 2013, 52, 13719-13729. dx.doi.org/10.1021/ic402317g.*

Zhang, Zizhuo, et al., "Area-selective atomic layer deposition of cobalt oxide to generate patterned cobalt films". Journal of Vacuum Science & Technology A 37(2), Mar./Apr. 2019, 020905 pp. 1-9 (2019). https://doi.org/10.1116/1.5066437.*

Kerrigan, Marissa M., et al., "Low Temperature, Selective Atomic Layer Deposition of Cobalt Metal Films Using Bis(1,4-di-tert-butyl-1,3-diazadienyl)cobalt and Alkylamine Precursors". Chemistry of Materials, 2017, 29, 7458-7466. DOI: 10.1021/acs.chemmater.7b02456.*

Yuan, Xianxia, et al., "Effects of cobalt precursor on pyrolyzed carbon-supported cobalt-polypyrrole as electrocatalyst toward oxygen reduction reaction". Nanoscale Research Letters 2013, 8:478, pp. 1-11.*

Cohen-Hyams, Tzipi, et al., "Structure of Electrodeposited Cobalt". Electrochemical and Solid-State Letters, 5 (8) C75-C78 (2002).*

Kerrigan, Marissa M., et al., "Substrate selectivity in the low temperature atomic layer deposition of cobalt metal films from bis(1,4-di-tert-butyl-1,3-diazadienyl)cobalt and formic acid". The Journal of Chemical Physics 146, 052813 (2017) pp. 1-8.*

Im, Min-Sik, et al., "Effect of copper surface pre-treatment on the properties of CVD grown graphene". AIP Advances 4, 127107 (2014); pp. 1-8.*

Chavez, K.L., et al., "A Novel Method of Etching Copper Oxide Using Acetic Acid". Journal of The Electrochemical Society, 148 (11) G640-G643 (2001).*

* cited by examiner

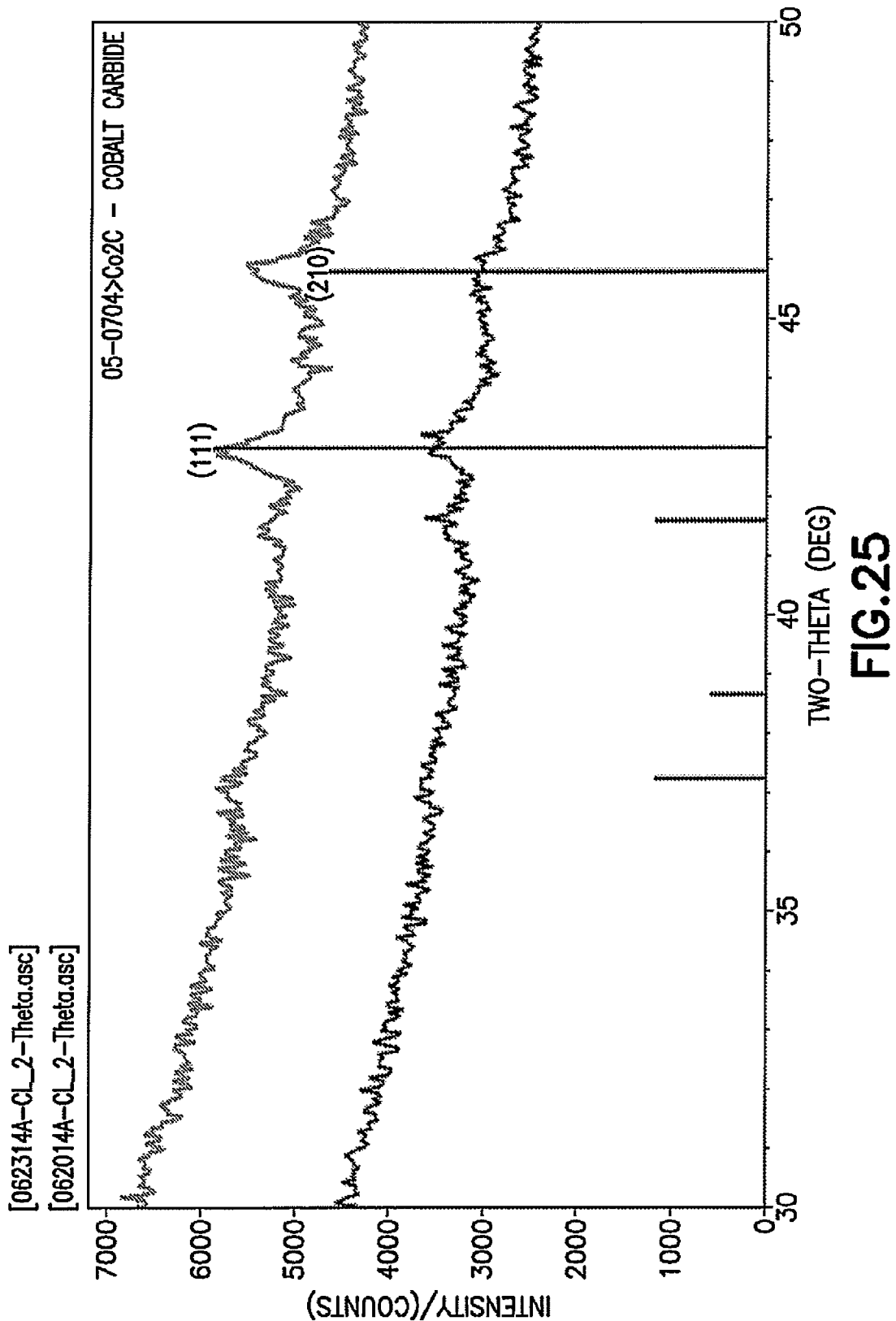

COBALT DEPOSITION SELECTIVITY ON COPPER AND DIELECTRICS

CROSS-REFERENCE TO RELATED APPLICATIONS

The benefit of priority under 35 U.S.C. § 119 of U.S. Provisional Patent Application No. 62/050,166 filed Sep. 14, 2014, U.S. Provisional Patent Application No. 62/107,273 filed Jan. 23, 2015, and U.S. Provisional Patent Application No. 62/110,078 filed Jan. 30, 2015 is hereby claimed. The disclosures of such U.S. provisional patent applications are hereby incorporated herein by reference, in their respective entireties, for all purposes.

FIELD

The present disclosure relates to cobalt precursors for precursors and processes for forming cobalt on substrates, e.g., in the manufacture of semiconductor products, flat-panel displays, and solar panels.

DESCRIPTION OF THE RELATED ART

Cobalt is finding increasing use in semiconductor manufacturing, such as in fabrication of integrated circuits in which cobalt disilicide has been progressively displacing titanium silicide as feature and linewidth dimensions decrease, since it does not entail the linewidth dependent sheet resistance issues that are characteristic of titanium silicide. Cobalt also is currently under consideration as a conductive cap over copper lines or as part of the barrier/adhesion layer liner for copper lines and contacts, as an encapsulant material, as a seed material for electroless and electroplating processes, and as a replacement material for copper in wiring and interconnects of integrated circuits. Cobalt additionally has elicited interest as a result of its magnetic properties for data storage applications and its potential for spintronics applications.

Interconnects are critical components of integrated circuitry, providing power/ground connections and distribution of clock and other signals. Local interconnects comprise the lines that connect gates and transistors, intermediate interconnects provide wiring within functional blocks of integrated circuitry, and global interconnects distribute clock and other signals and provide power/ground connections for the entire integrated circuit. Interconnects increasingly are a dominant factor in determining system performance and power dissipation of integrated circuits.

In the manufacture of integrated circuitry devices in which copper is used as a metallization material, cobalt liners and back end of the line (BEOL) interconnect caps have been developed for protection of copper interconnects.

Such cobalt capping has been contemplated to enhance the electromigration (EM) resistance of copper interconnects, and carbonyl precursors have been proposed for such capping applications. Carbonyls, however, are not optimum precursors due to the formation of CO as a by-product in the vapor deposition. Furthermore, the oxygen in the carbonyl may react with copper and form oxide in the cobalt/copper interface that degrades the EM resistance.

As a specific concern related to the foregoing issues in the advance of semiconductor technology beyond the 14 nm node, e.g., to the 7 nm and 5 nm technology nodes, metal line and via fill processing face increasing challenges to reduce interconnect metal line resistance and to establish high-yield void-free fill, particularly where copper is present in a via, and tantalum, tantalum nitride, ruthenium, and ruthenium alloys may be employed as copper-diffusion barrier/liner materials in the backend process.

Accordingly, cobalt precursors and corresponding deposition processes are desired, which do not suffer from such deficiencies.

SUMMARY

The present disclosure relates to non-oxygen-containing cobalt precursors that are useful for forming cobalt on substrates, e.g., substrates comprising copper on which cobalt is to be deposited with the substrate also comprising dielectric material such as ultra-low dielectric constant material on which cobalt deposition is desirably avoided. The disclosure also relates to compositions comprising such cobalt precursors, and processes and products related to such cobalt precursors.

In one aspect, the disclosure relates to a process for forming cobalt on a substrate, comprising: volatilizing a cobalt precursor to form a precursor vapor, wherein the cobalt precursor comprises a precursor selected from the group consisting of: (i) cobalt bis-diazadiene compounds whose diazadiene moieties are optionally independently substituted on nitrogen and/or carbon atoms thereof with substituents selected from the group consisting of: H; $C_1$-$C_8$ alkyl; $C_6$-$C_{10}$ aryl; $C_7$-$C_{16}$ alkylaryl; $C_7$-$C_{16}$ arylalkyl; halo; amines; amidinates; guanidinates; cyclopentadienyls, optionally substituted with $C_1$-$C_8$ alkyl, amines, or halo substituents; $C_1$-$C_8$ alkoxy; hydroxyl; oximes; hydroxyamines; acetates; carbonyls; beta-diketonates; and beta-ketoiminates; and (ii) cobalt compounds containing acetylenic functionality; and
contacting the precursor vapor with the substrate under vapor deposition conditions effective for depositing cobalt on the substrate from the precursor vapor, wherein the vapor deposition conditions include temperature not exceeding 200° C., and wherein the substrate includes copper surface and dielectric material surface In another aspect, the disclosure relates to an article comprising cobalt deposited on a substrate, as formed by a method comprising a process according to the present disclosure, as variously described herein.

A further aspect of the disclosure relates to a method of reducing defects in a deposited metal dial is vapor deposited on a base metal, such method comprising cleaning the base metal, prior to vapor deposition of the deposited metal thereon, with a cleaning composition comprising base and oxidizing agent having pH in a range of from 5 to 10.

Yet another aspect of the disclosure relates to a method of reducing defects in cobalt that is vapor deposited on copper, such method comprising cleaning the copper, prior to deposition of the cobalt thereon, with a cleaning composition comprising base and oxidizing agent, having pH in a range of from 5 to 10.

A further aspect of the disclosure relates to a method of reducing defects in cobalt that is vapor deposited on tungsten, such method comprising cleaning the tungsten, prior to deposition of the cobalt thereon, with a cleaning composition comprising etchant, oxidizing agent, and optionally corrosion inhibitor, having pH in a range of from 0 to 4.

In another aspect, the disclosure relates to a method of reducing defects in a deposited cobalt that is vapor deposited on a base metal, wherein the cobalt is deposited by a process of the present disclosure, such method comprising cleaning the base metal, prior to vapor deposition of the deposited cobalt thereon, wherein the cleaning comprises (i) contacting the base metal with a cleaning composition comprising base and oxidizing agent, having pH in a range of from 5 to 10; (ii) contacting the base metal with a cleaning composition comprising etchant, oxidizing agent, and optionally corrosion inhibitor, having pH in a range of from 0 to 4; (iii) treating the base metal with hydrogen plasma; or (iv) treating the base metal with hydrogen fluoride.

Yet another aspect of the disclosure relates to a method of forming deposited cobalt on a substrate, wherein prior to vapor deposition of cobalt on the substrate, the substrate is cleaned with a cleaning composition selected from among (i) cleaning compositions comprising base and oxidizing agent, having pH in a range of from 5 to 10, and (ii) cleaning compositions comprising etchant, oxidizing agent, and optionally corrosion inhibitor, having pH in a range of from 0 to 4, wherein the cleaning of the substrate is effective for at least one of (a) reducing defectivity of the deposited cobalt, (b) removing $CF_X$ components from the substrate, and (c) removing or pulling back TiN present on the substrate.

A further aspect of the disclosure relates to a via fill process, comprising vapor depositing cobalt in a via for fill thereof, wherein the cobalt is vapor deposited over a copper surface in the via. Another aspect of the disclosure relates to a void-free filled via as formed by such a process.

A further aspect of the disclosure relates to a process for forming cobalt on a substrate comprising metal-containing surface and oxide material surface, the process comprising contacting the substrate, under vapor deposition conditions effective for depositing cobalt on the substrate, with vapor of a cobalt precursor that is effective under the vapor deposition conditions to selectively deposit cobalt on the metal-containing surface of the substrate but not the oxide material surface of the substrate.

Other aspects, features and embodiments of the disclosure will be more fully apparent from the ensuing description and appended claims.

BRIEF DESCRIPTION OF THE DRAWINGS

FIG. 25 is an XRD plot of a cobalt film deposited from the Co(tBuNCHCHNtBu)$_2$ precursor on a fluorine-free tungsten substrate, in arbitrary intensity units as a function of the two-theta angle, in degrees. The upper line in this plot shows the data for deposition at 290° C., and cobalt film thickness of 208.7 Å. The lower line in this plot shows the data for deposition at 250° C., and cobalt film thickness of 127.4 Å.

DETAILED DESCRIPTION

Figure 1:
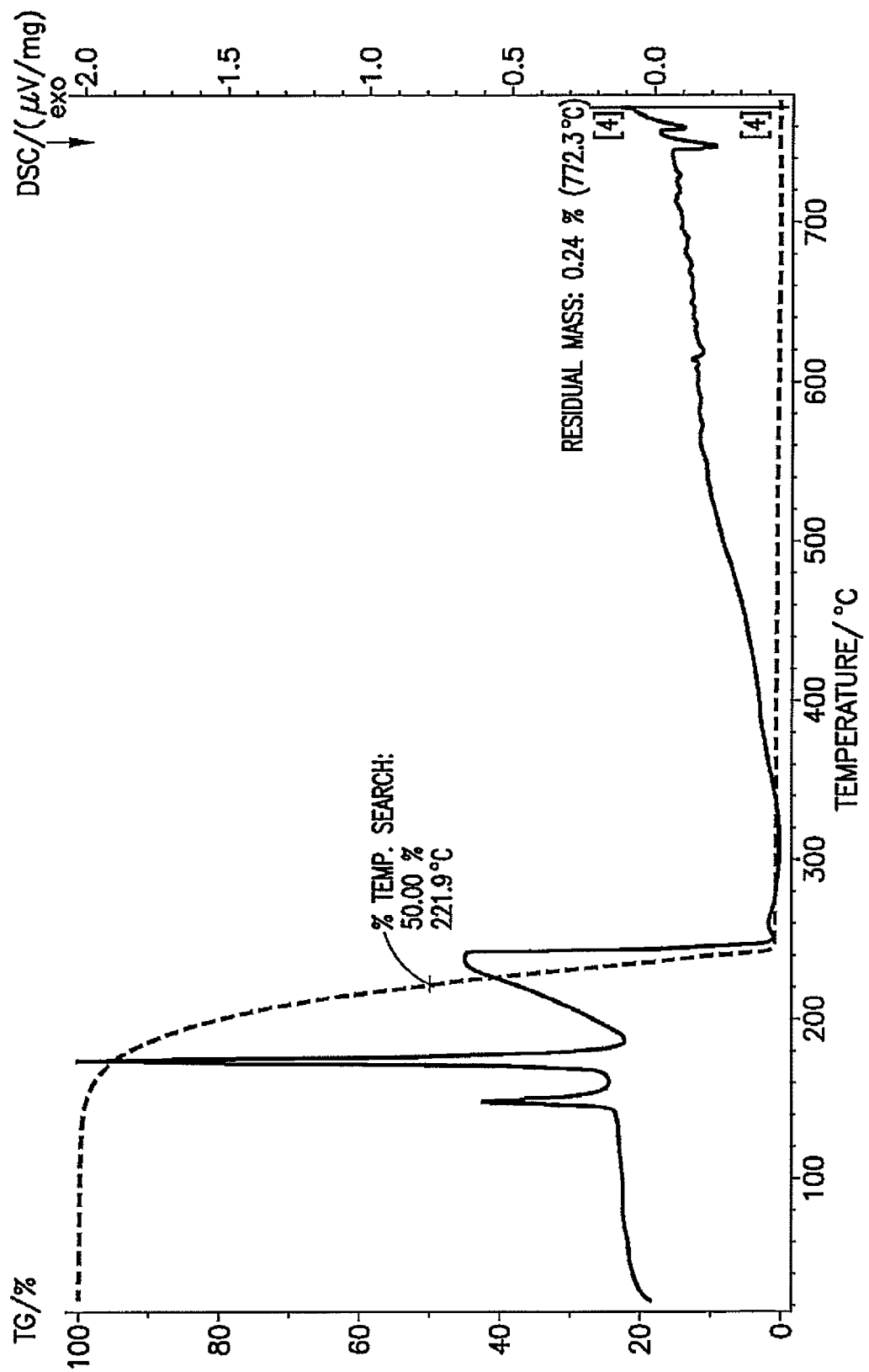
FIG. 1 is a thermogravimetric and differential scanning calorimetry plot for Co(tBuNCHCHNtBu)$_2$, showing a $T_{50}$ value of 221.9° C., and a residual mass value of 0.2% at temperature of 772.3° C. for such cobalt precursor.

The present disclosure relates to non-oxygen-containing cobalt precursors that are useful for forming cobalt on substrates in surface-selective deposition processes, e.g., deposition on substrates comprising copper on which cobalt is to be deposited with the substrate also comprising dielectric material such as ultra-low dielectric constant material on which cobalt deposition is desirably avoided.

The disclosure further relates to compositions comprising the aforementioned non-oxygen-containing cobalt precursors, and surface-selective deposition processes utilizing such precursors and compositions, as well as to microelectronic products, flat panel displays, and solar panels, and component structures therefor, produced using such precursors and precursor compositions.

As used herein and in the appended claims, the singular forms "a", "and", and "the" include plural referents unless the context clearly dictates otherwise.

As used herein, the term "film" refers to a layer of deposited material having a thickness not exceeding 10 micrometers, e.g., from such value down to atomic monolayer thickness values. In various embodiments, film thicknesses of deposited material layers in the practice of the disclosure may for example not exceed 5 micrometers, or not exceed 1 micrometer, or in various thin film regimes be below 200, 10 or 1 nanometer(s) film thickness, depending on the specific application involved, however it will be recognized that cobalt-containing material in the broad practice of the present disclosure may have any suitable thickness for tire application that is involved.

As used herein, the term "cobalt" is intended to be broadly construed to include elemental cobalt, as well as cobalt-containing compounds, mixtures, and alloys.

As used herein, the identification of a carbon number range, e.g., in $C_1$-$C_{12}$ alkyl, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the invention, and that ranges of carbon numbers specifically excluding a carbon number or numbers are included in the invention, and sub-ranges excluding either or both of carbon number limits of specified ranges are also included in the invention. Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the invention, the carbon number range to be further restricted, as a sub-group of moieties having a carbon number range within the broader specification of the substituent moiety. By way of example, the carbon number range $C_1$-$C_{12}$ alkyl, may be more restrictively specified, in particular embodiments of the invention, to encompass sub-ranges such as $C_1$-$C_4$ alkyl, $C_2$-$C_8$ alkyl, $C_2$-$C_4$ alkyl, $C_3$-$C_5$ alkyl, or any other sub-range within the broad carbon number range.

The precursors of the invention may be further specified in specific embodiments by provisos or limitations excluding specific substituents, groups, moieties or structures, in relation to various specifications and exemplifications thereof set forth herein. Thus, the invention contemplates restrictively defined compositions, e.g., a composition wherein $R^i$ is $C_1$-$C_{12}$ alkyl, with the proviso that $R^i \neq C_4$ alkyl when $R^j$ is silyl.

"Aryls" as used herein includes hydrocarbons derived from benzene or a benzene derivative that are unsaturated aromatic carbocyclic groups of from 6 to 10 carbon atoms. The aryls may have a single or multiple rings. The term "aryl" as used herein also includes substituted aryls. Examples include, but are not limited to phenyl, naphthyl, xylene, phenylethane, substituted phenyl, substituted naphthyl, substituted xylene, substituted phenylethane and the like.

As used herein, the term "ultra-low" in reference to dielectric constant means a dielectric constant that is below 2.5.

The precursors of the invention can be supplied in any suitable form for volatilization to produce the precursor vapor for deposition contacting with the substrate, e.g., in a liquid form that is vaporized or as a solid that is dissolved or suspended in a solvent medium for flash vaporization, as a sublimable solid, or as a solid having sufficient vapor pressure to render it suitable for vapor delivery to the deposition chamber, or in any other suitable form.

When solvents are employed for delivery of the precursors of the invention, any suitable solvent medium can be employed in which the precursor can be dissolved or dispersed for delivery. By way of example, the solvent medium may be a single-component solvent or a multicomponent solvent mixture, including solvent species such as $C_3$-$C_{12}$ alkanes, $C_2$-$C_{12}$ ethers, $C_6$-$C_{12}$ aromatics, $C_{10}$-$C_{25}$ arylalkanes, $C_{10}$-$C_{25}$ arylcyloalkanes, and further alkyl-substituted forms of aromatic, arylkane and arylcyloalkane species, wherein the further alkyl substituents in the case of multiple alkyl substituents may be the same as or different from one another and wherein each is independently selected from $C_1$-$C_8$ alkyl. Illustrative solvents include amines, ethers, aromatic solvents, glymes, tetraglymes, alkanes, alkyl-substituted benzene compounds, benzocyclohexane (tetralin), alkyl-substituted benzocyclohexane and ethers, with tetrahydrofuran, xylene, 1,4-tertbutyltoluene, 1,3-diisopropylbenzene dimethyltetralin, octane and decane being potentially useful solvent species in specific applications. In one embodiment, the solvent is selected from among tertiary amines, ethers and aromatic solvent.

The non-oxygen-containing cobalt precursors of the present disclosure include

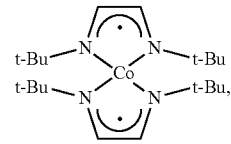

Co(tBuNCHCHNtBu)$_2$, also referred to herein as Co(tBuDAD)$_2$ or Co-diazadiene, and cobalt precursors with mono- or bis-substituted alkyl-1,3-diazabutadienyl ligands, as usefully employed in selective surface deposition processes in accordance with the present disclosure.

It has been discovered by the present inventors that Co(tBuDAD)$_2$ provides a perfect selectivity of cobalt coating on copper versus dielectric surface, i.e., enabling cobalt to be deposited only on copper surfaces but not on ultra-low dielectric constant (ULK) material surfaces when copper and ULK dielectric surfaces of a substrate are concurrently contacted with Co(tBuDAD)$_2$ precursor vapor, when the contacting is carried out at temperature not exceeding 200° C., e.g., at temperature in a range of from 130° C. to 200° C. Deposition of cobalt using such Co(tBuDAD)$_2$ precursor at temperature in the upper portion of such range, such as at temperature of 180° C. to 200° C. can be carried out with deposition rates of greater than 1 nm/minute. When utilizing lower temperatures for such contacting, such as 150° C., the same selectivity of copper surfaces versus ULK material surfaces can be achieved, albeit at lower deposition rates, as for example a deposition rate of ~0.5 nm/minute, on the copper surface.

The present disclosure more generally contemplates the use of cobalt precursors with mono- or bis-substituted alkyl-1,3-diazabutadienyl ligands can be employed in selective surface deposition processes.

Cobalt precursors of the general formula {RNCHCHNR}$_2$Co, or {R'NCRCRNR'}$_2$Co, wherein each R and R' is independently selected from among $C_1$-$C_8$ alkyl can be utilized for deposition in atomic layer deposition (ALD) and chemical vapor deposition (CVD) processes in the broad practice of the present disclosure, as can mono-substituted $C_1$-$C_8$ alkyl-1,3-diazabutadienyl cobalt complexes, containing other ligands, e.g., ligands selected from the following: halides, alkoxides, dialkoxides, amides, diamides, imides, oximes, hydroxylamines, amidinates, guanidinates, acetates, carbonyls, alkyls, cyclopentadienyls, beta-diketonates, and betaketoiminates. As discussed hereinabove, in various applications involving capping of copper metallization, oxygen-containing ligands are desirably avoided, however, in other applications contemplated by the present application, such oxic ligands may be usefully employed in corresponding cobalt precursors, such as in the ALD or CVD deposition of cobalt oxide, cobalt nitride, cobalt carbide, cobalt silicide, or other cobalt alloy thin films. The disclosure in other aspects contemplates cobalt precursors containing acetylene groups. Other cobalt precursors that can be used in the broad practice of the present invention, e.g., to form cobalt capping layers on copper comprised in substrates also including dielectric surface, particularly ultra-low dielectric material surfaces, include the cobalt compounds disclosed in U.S. Patent Application Publication 20130164456 published Sep. 27, 2013 in the name of Charles H. Winter, et al. and Winter, et al Organometallics 2011, 30, p. 5010.

The diazadiene (DAD)-based cobalt compounds of the present disclosure can be synthesized as described in U.S. Patent Application Publication 20130251903 published Sep. 26, 2013 in the name of Won Seok Han. Other cobalt precursors described herein can be synthesized within the skill of the art based on the disclosure herein.

Accordingly, in one aspect, the disclosure relates to a process for forming cobalt on a substrate, comprising:
volatilizing a cobalt precursor to form a precursor vapor, wherein the cobalt precursor comprises a precursor selected from the group consisting of: (i) cobalt bis-diazadiene compounds whose diazadiene moieties are optionally independently substituted on nitrogen and/or carbon atoms thereof with substituents selected from the group consisting of: H; $C_1$-$C_8$ alkyl; $C_6$-$C_{10}$ aryl; $C_7$-$C_{16}$ alkyl aryl; $C_7$-$C_{16}$ arylalkyl; halo; amines, amidinates; guanidinates; cyclopentadienyls, optionally substituted with $C_1$-$C_8$ alkyl, amines, or halo substituents; $C_1$-$C_8$ alkoxy; hydroxyl; oximes; hydroxyamines; acetates; carbonyls; beta-diketonates; and beta-ketoiminates; and (ii) cobalt compounds containing acetylenic functionality; and
contacting the precursor vapor with the substrate under vapor deposition conditions effective for depositing cobalt on the substrate from the precursor vapor, wherein the vapor deposition conditions include temperature not exceeding 200° C., and wherein the substrate includes copper surface and dielectric material surface.

In specific embodiments of such process, the cobalt precursor comprises a precursor selected from the group consisting of (i) cobalt bis-diazadiene compounds whose diazadiene moieties are optionally independently substituted on nitrogen and/or carbon atoms thereof with substituents selected from the group consisting of: H; $C_1$-$C_8$ alkyl; $C_6$-$C_{10}$ aryl; $C_7$-$C_{16}$ alkylaryl; $C_7$-$C_{16}$ arylalkyl; halo; amines; amidinates; guanidinates; cyclopentadienyls, optionally substituted with $C_1$-$C_8$ alkyl, amines, or halo substituents; $C_1$-$C_8$ alkoxy; hydroxyl; oximes; hydroxyamines; acetates; carbonyls; beta-diketonates; and beta-ketoiminates.

In other embodiments, the cobalt precursor comprises a precursor selected from the group consisting of (i) cobalt bis-diazadiene compounds whose diazadiene moieties are optionally independently substituted on nitrogen and/or carbon atoms thereof with substituents selected from the group consisting of: H; $C_1$-$C_8$ alkyl; $C_6$-$C_{10}$ aryl; $C_7$-$C_{16}$ alkylaryl; $C_7$-$C_{16}$ arylalkyl; halo; amines; amidinates; guanidinates; cyclopentadienyls, optionally substituted with $C_1$-$C_8$ alkyl amines, or halo substituents.

In yet other embodiments, the cobalt precursor comprises

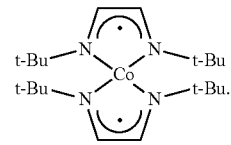

In still other embodiments of the process, the cobalt precursor comprises a cobalt precursor of the formula {RNCHCHNR}$_2$Co, or {R'NCRCRNR'}$_2$Co, wherein each R and R' is independently selected from among $C_1$-$C_8$ alkyl.

The process may comprise in additional embodiments the cobalt precursor comprising a cobalt compound containing acetylenic functionality, e.g., wherein the cobalt precursor comprises a cobalt compound selected from the group consisting of dicobalt hexacarbonyl tert-butylacetylene; dicobalt hexacarbonyl trimethylsilyl acetylene; and cobalt carbonyl bis(trimethylsilyl acetylene.

The dielectric material in the process of the disclosure may comprise an ultra-low k dielectric material.

In various embodiments, the process of the disclosure is characterized by one or more of the following features or characteristics: being conducted to cap a copper metallization element on the substrate; mixing the precursor vapor with hydrogen for the contacting; further comprising annealing the cobalt deposited on the substrate, e.g., involving rapid thermal annealing; conducting the contacting at temperature in a range of from 60° C. to 200° C., or at temperature in a range of from 130° C. to 200° C., e.g., at temperature in a range of from 180° C. to 200° C., and a cobalt deposition rate of greater than 1 nm/minute: conducting the process with a cobalt precursor with mono- or bis-substituted alkyl-1,3-diazabutadienyl ligands; conducting the contacting in an ALD process; conducting the contacting in a CVD process; conducting the contacting to deposit cobalt on the substrate to form a cobalt compound thereon, wherein the cobalt compound is selected from the group consisting of cobalt oxide, cobalt nitride, cobalt carbide, cobalt silicide, and mixtures thereof; wherein the deposited cobalt forms an electrode; wherein the substrate comprises a gate or capacitor structure; wherein the deposited cobalt forms a capping layer, e.g., overlying a copper structure or via; wherein the deposited cobalt forms an encapsulating layer, e.g., covering a copper interconnect element; wherein the deposited cobalt forms of diffusion layer; wherein the deposited cobalt forms a seed for electroplating of metal thereon; wherein the vapor deposition conditions comprise a deposition pressure in a range of from 2 to 1200 torr; wherein the vapor deposition conditions comprise a deposition pressure in a range of from 5 to 100 torr; wherein the cobalt precursor is volatilized by vaporization of a solvent solution thereof, such as where the solvent in the solvent solution comprises an organic solvent, or a hydrocarbon solvent, or a $C_4$-$C_{10}$ alkane solvent, e.g., octane; wherein the precursor vapor is transported in a carrier gas for the contacting thereof with the substrate, as for example a gas selected from the group consisting of argon, neon, xenon, krypton, helium, and hydrogen; wherein the contacting of the precursor vapor with the substrate is conducted for a period of from 2 to 60 minutes; further comprising annealing the cobalt deposited on the substrate by thermal annealing at temperature in a range of from 200° C. to 600° C., or a range of from 350° C. to 550° C., or wherein the thermal annealing is conducted for a period of time sufficient to reduce resistivity of the deposited cobalt, by an amount in a range of from 25% to 90% of the as-deposited resistivity of the cobalt film; wherein the contacting of the precursor vapor with the substrate is carried out for a period of time sufficient to deposit cobalt on the substrate at a thickness in a range of from 2 nm to 1000; wherein the cobalt deposited on the substrate has a resistivity in a range of from 7 to 48 $\mu\Omega$-cm, or a resistivity in a range of from 10 to 40 $\mu\Omega$-cm; and wherein the cobalt is deposited on the substrate as a film thereon.

The disclosure relates in various other aspects to an article comprising cobalt deposited on a substrate, as formed by a method comprising a process as variously described herein, in any of the embodiments herein disclosed. The article may for example comprise a semiconductor device, flat-panel display, or solar panel. In specific embodiments, the deposited cobalt may comprise an electrode. In other embodiments, the article may comprise a gate of capacitor structure. In still other embodiments, the deposited cobalt may form a capping layer, e.g., overlying a via. The deposited cobalt in other embodiments may form an encapsulating layer, e.g., covering a copper interconnect element. The deposited cobalt in other embodiments may form a diffusion barrier in the article. In still further embodiments, the deposited cobalt may form a seed for electroplating of metal thereon.

It will be recognize that the process and article of the present disclosure may be constituted, embodied, and implemented, in any of her variety of suitable manners, as will be apparent to those of ordinary skill in the art, based on the disclosure herein.

Thus, in various aspects, the present disclosure relates to a process for forming cobalt on a substrate, comprising: volatilizing a cobalt precursor of the disclosure, to form a precursor vapor; and contacting the precursor vapor with the substrate under vapor deposition conditions effective for depositing cobalt on the substrate from the precursor vapor, wherein the vapor deposition conditions include temperature not exceeding 200° C., wherein the substrate includes copper surface and dielectric material, e.g., ultra-low dielectric material.

In various embodiments of such process, the cobalt precursor is volatilized by vaporization of a solvent solution thereof. The solvent solution may for example comprise an organic solvent, such as a hydrocarbon solvent, e.g., a solvent selected from the group consisting of alkane solvents, aromatic solvents, ketone solvents, ether solvents, etc. In various embodiments, the solvent may comprise an alkane solvent, e.g., a $C_4$-$C_{10}$ alkane solvent, such as butane, pentane, hexane, heptane, octane, nonane, or decane, or, more generally, any other solvent species, solvent mixture, etc. that is compatible with foe cobalt precursor.

The process of the present disclosure may be conducted, in various embodiments, with the precursor vapor being transported in a carrier gas to the contacting step in which the precursor vapor/carrier gas mixture is contacted with the substrate to effect deposition of cobalt on the substrate. The carrier gas may be of any suitable type, and may include any suitable carrier gas or gases that are compatible with the precursor vapor. The carrier gas may for example comprise an inert or other suitable gas, such as argon, neon, xenon, krypton, helium, hydrogen, etc.

The vapor deposition conditions in the above-described process may in various embodiments comprise pressure in a suitable range, e.g., a range of from 2 to 1200 torr, a range of from 2 to 100 torr, a range of from 5 to 100 torr, a range of from 5 to 70 torr, a range of from 10 to 50 Torr, or pressure in other suitable pressure range. The vapor deposition conditions in various embodiments may comprise temperature in a range of from 25° C. to 200° C., a range of from 60° C. to 200° C., a range of from 100° C. to 200° C., a range of from 120° C. to 175° C., a range of from 125° C. to 165° C., or temperature in other suitable temperature range.

The cobalt precursor vapor may be mixed with co-reactants and/or carrier gases, for delivery to the contacting of the precursor vapor with the substrate. The substrate may be of any suitable type that includes copper surface and dielectric material surface, and may for example comprise a semiconductor substrate, such as a silicon oxide substrate, a metal substrate, or a glass, ceramic, or other appropriate substrate for the specific product to be formed comprising the cobalt film, which includes such copper and dielectric surface.

The contacting of the precursor vapor with the substrate in processes of the disclosure may be carried out for any suitable period of time, e.g., a period of from 2 to 60 minutes, a period of from 3 to 15 minutes, a period of from 5 to 12 minutes, or other suitable period of time. In various embodiments, the contacting is conducted for a period of time sufficient to deposit a predetermined thickness of the deposited cobalt. Such thickness may be of any suitable magnitude, e.g., a thickness in a range of from 2 nm to 1000 nm, a thickness in a range of from 2 nm to 500 nm, a thickness in a range of from 4 nm to 400 nm, a thickness in a range of from 5 nm to 300 nm, or thickness in other thickness range.

In various embodiments, the cobalt film after the contacting is annealed by a thermal annealing process. The thermal annealing can be carried out at any suitable annealing conditions, e.g., temperature in a range of from 200° C. to 600° C., a range of from 200° C. to 550° C. a range of from 350° C. to 550° C., a range of from 375° C. to 450° C., or temperature in other suitable temperature range.

In various embodiments of the process of the present disclosure, the thermal annealing can be conducted for a suitable period of time to achieve a desired resistivity, sheet resistance, and/or other desired characteristics of the film. For example, the annealing can be carried out for a period in a range of from 1 minute to 20 minutes, in a range of from 2 minutes to 15 minutes, in a range of from 10 to 12 minutes, or other period of time. The thermal annealing may be conducted for a period that is effective to reduce resistivity of the cobalt film as deposited on the substrate, e.g., by an amount in a range of from 25% to 90% of the as-deposited resistivity of the cobalt film, in a range of from 30% to 80% reduction, in a range of from 40% to 75% reduction, or in other range of reduction of resistivity, to yield a desired resistivity value, e.g., a resistivity in a range of from 10 to 40 $\mu\Omega$-cm.

The cobalt film formed by processes of the present disclosure has high purity and low resistivity, e.g., a resistivity in a range of from 7 to 48 $\mu\Omega$-cm, a range of from 10 to 45 µΩ-cm, a range of from 15 to 40 µΩ-cm, a range of from 18 to 38 µΩ-cm, or resistivity in other suitable range.

In specific embodiments of the process of the present disclosure, the contacting of the precursor vapor with the substrate may be carried out with delivery of the precursor vapor to the substrate at a suitable rate to achieve the desired deposited cobalt thickness and other properties. In specific embodiments, the precursor vapor maybe flowed to the substrate for contacting thereof, at a flow rate that is in a range of from 20 to 200 µmoles/minute. The cobalt precursor may be flowed to the contacting step in the mixture with hydrogen or other co-flow gas or gases. Such a co-flow gases may be delivered at any suitable rate, e.g., a rate in a range of from 1 to 5 L per minute, or other suitable flow rate. The contacting may be carried out at pressure in a range of from 10 to 50 torr in various specific embodiments. Cobalt may be deposited on the substrate from the precursor vapor at any suitable deposition rate, such as a deposition rate in a range of from 2 to 20 Å/minute, a deposition rate in a range of from 1 to 10 Å/minute, or other deposition rate.

The cobalt film in various embodiments of the present invention can be formed at any suitable thickness, e.g., a thickness in a range of from 75 Å to 500 Å, a thickness in a range of from 10 Å to 400 Å, a thickness in a range of from 20 Å to 300 Å, or thickness in another range.

The processes of the present disclosure may be carried out to produce cobalt films of superior electrical character.

In specific embodiments of the process of the present disclosure, the cobalt precursor is volatilized to form the precursor vapor, and the cobalt film deposited on the substrate is annealed by a thermal annealing process. The thermal annealing process in such application may be conducted for any suitable period of time and at any suitable temperature. In illustrative embodiments, the annealing may be conducted for a period of from 1 minute to two hours at temperature in a range of from 150° C. to 500° C., e.g., or for a period of from 1 to 15 minutes at temperature in a range of from 375° C. to 450° C., or under other suitable time and temperature conditions.

The cobalt films of the present disclosure as formed by method comprising the process according to any of the previously described embodiments can be utilized to form devices comprising the high purity, low resistivity cobalt films. Such devices may be of any suitable type, and in various embodiments may comprise a semiconductor device, flat-panel display, or solar panel. The present disclosure therefore contemplates a thin-film structure comprising a vapor-deposited high purity, low resistivity cobalt film, such as a high purity, low resistivity cobalt film formed by a method comprising a process according to any of the embodiments and aspects described hereinabove.

The present disclosure thus contemplates a process for forming cobalt on a substrate in which a cobalt precursor is volatilized to form precursor vapor that is contacted with the substrate under vapor deposition conditions effective for depositing cobalt on the substrate from the precursor vapor. The deposited cobalt may be employed to fill a via of the substrate, with the cobalt being deposited over a copper surface in the via. The copper surface may be at a lower portion or at a bottom of the via. The via may have a diameter in a range of from 15 nm to 45 nm in various embodiments, and in other embodiments may have a diameter of less than 15 nm. The via may have an aspect ratio in a range of from 1:1 to 5:1, and in a specific embodiment may have an aspect ratio of 3:1.

The copper surface in the via may have one or more layers deposited thereon, with the cobalt being deposited on an outermost surface of such one or more layers. For example, the one or more layers may comprise a layer of tantalum on the copper surface, and a layer of tantalum nitride, wherein the outermost surface comprises surface of the layer of tantalum nitride. As another example, live one or more layers may include a layer of ruthenium on the copper surface, a layer of tantalum on the layer of ruthenium, and a layer of tantalum nitride on the layer of tantalum, in which the outermost surface comprises surface of the layer of tantalum nitride. As a still further example, the one or more layers may include a layer of ruthenium on the copper surface, in which the outermost surface comprises surface of the layer of ruthenium.

The via fill process may be conducted with any suitable cobalt precursor for the vapor deposition of cobalt, including the cobalt precursors variously described herein. The vapor deposition may comprise any suitable vapor deposition technique, e.g., chemical vapor deposition (CVD).

The via fill process may be conducted in a dual-damascene structure, as part of a corresponding process for semiconductor manufacturing. The via fill process may be conducted on a substrate from which a TiN hard mask has been removed, as hereinafter more fully discussed. The cobalt in the via fill method may in specific embodiments be deposited at temperature not exceeding about 200° C.

The disclosure correspondingly contemplates a void-free filled via as formed by a process described above.

In a further aspect, the disclosure relates to a process for forming cobalt on a substrate comprising metal-containing surface and oxide material surface, the process comprising contacting the substrate, under vapor deposition conditions effective for depositing cobalt on the substrate, with vapor of a cobalt precursor that is effective under the vapor deposition conditions to selectively deposit cobalt on the metal-containing surface of the substrate but not the oxide material surface of the substrate. As used in such context, the "metal-containing surface" can contain any metal or any combination of metals, e.g., alloys, as well as non-oxide compounds of such metals.

In such process for forming cobalt on a substrate comprising metal-containing surface and oxide material surface, the metal-containing surface can comprise metal selected from the group consisting of copper, tantalum, ruthenium, tungsten, aluminum, and cobalt. In specific embodiments, the metal-containing surface may comprise a metal nitride, e.g., tantalum nitride. The oxide material surface may comprise dielectric material in various embodiments. In specific embodiments, the oxide material surface may comprise a silicon oxide material.

The cobalt precursor utilized in the foregoing process may be of any suitable type(s), and may for example comprise a precursor selected from the group consisting of (i) cobalt bis-diazadiene compounds whose diazadiene moieties are optionally independently substituted on nitrogen and/or carbon atoms thereof with substituents selected from the group consisting of: H; C1-C8 alkyl; C6-C10 aryl; C7-C16 alkylaryl; C7-C16 arylalkyl; halo; amines; amidinates; guanidinates; cyclopentadienyls, optionally substituted with C1-C8 alkyl, amines, or halo substituents; C1-C8 alkoxy; hydroxyl; oximes; hydroxyamines; acetates; carbonyls; beta-diketonates; and beta-ketoiminates; and (ii) cobalt compounds containing acetylenic functionality.

In the foregoing process for forming cobalt on a substrate comprising metal-containing surface and oxide material surface, the vapor deposition conditions in various embodiments comprise temperature not exceeding about 200° C.

The vapor deposition in the foregoing process may comprise chemical vapor deposition or any other suitable type of vapor deposition.

The foregoing process may be carried out in various embodiments wherein the substrate comprises copper surface and $SiO_2$ surface. In other embodiments, the substrate comprises tantalum surface and and $SiO_2$ surface. In still other embodiments, the substrate may comprise tantalum nitride surface and $SiO_2$ surface.

The advantages and features of the disclosure are further illustrated with reference to the following examples, which is not to be construed as in any way limiting the scope of the disclosure but rather as illustrative of particular embodiments in specific implementations thereof.

Example 1

Cobalt deposition selectivity was evaluated, using Co(t-BUNCHCHNtBu) precursor, on silicon dioxide, copper, and ULK substrate surfaces, at "C", "L", and "BL" positions on the substrate surface. Initial deposition runs were carried out at temperatures of 290° C., 250° C., and 200° C., with the results shown in Table 1 below. Position "L" showed a lower deposition rate. Thickness of the deposited cobalt film, in Ångströms, was determined by x-ray fluorescence (XRF).

TABLE 1

| Substrate | Position | Temperature (C.) | XRF Thickness (A) |
|---|---|---|---|
| SiO2 | C | 290 | 113.8 |
| Copper | BL | 290 | 230.4 |
| SiO2 | C | 250 | 3.6 |
| Copper | L | 250 | 121 |
| ULK | C | 200 | 0 |
| Copper | L | 200 | 170 |

Next, selectivity was evaluated at temperature of 290° C., 250° C., 200° C., and 150° C., on silicon dioxide, copper, and ULK substrate surfaces, at "C", "L", and "BL" positions on the substrate surface using Co(tBUNCHCHNtBu) precursor. The precursor flow rate was 50 µmole/minute, with hydrogen being flowed to the contacting operation at the rate of 0.5 L per minute as a co-flow gas with the Co(t-BuNCHCHNtBu) precursor vapor. The contacting operation was carried out at pressure of 30 torr. Deposition rate, in Angstroms per minute, of the cobalt film on the various substrate surfaces was determined, with the results shown in Table 2.

TABLE 2

| Temperature (° C.) | Substrate | Position | Deposition Rate (A/min) |
|---|---|---|---|
| 290 | SiO$_2$ | C | 7.6 |
|  | Cu | BL | 15.4 |
| 250 | SiO$_2$ | C | 0.24 |
|  | Cu | CL | 8.1 |
| 200 | ULK | C | 0 |
|  |  | L | 0 |
|  | Cu | C | 11.7 |
|  |  | L | 11.3 |

TABLE 2-continued

| Temperature (° C.) | Substrate | Position | Deposition Rate (A/min) |
|---|---|---|---|
| 150 | ULK | CB | 0 |
|  |  | L | 0 |
|  | Cu | C | 3.6 |
|  |  | B | 4.9 |

As reflected by the data at 200° C. and 150° C., the Co(BUNCHCHNtBu) precursor showed excellent selectivity at temperatures of ≤200° C., depositing on copper surface but not on ULK surface on the substrate.

Example 2

The characteristics of Co(tBuNCHCHNtBu)$_2$, or Co(tBu-DAD)$_2$, were evaluated in a series of tests.

The thermogravimetric and differential scanning calorimetry characteristics of Co(tBuNCHCHNtBu)$_2$ were determined by corresponding TG/DSC analysis, generating the thermal characteristics plot shown in FIG. 1, showing a $T_{50}$ value of 221.9° C., and a residual mass value of 0.2% at temperature of 772.3° C.

Figure 2:
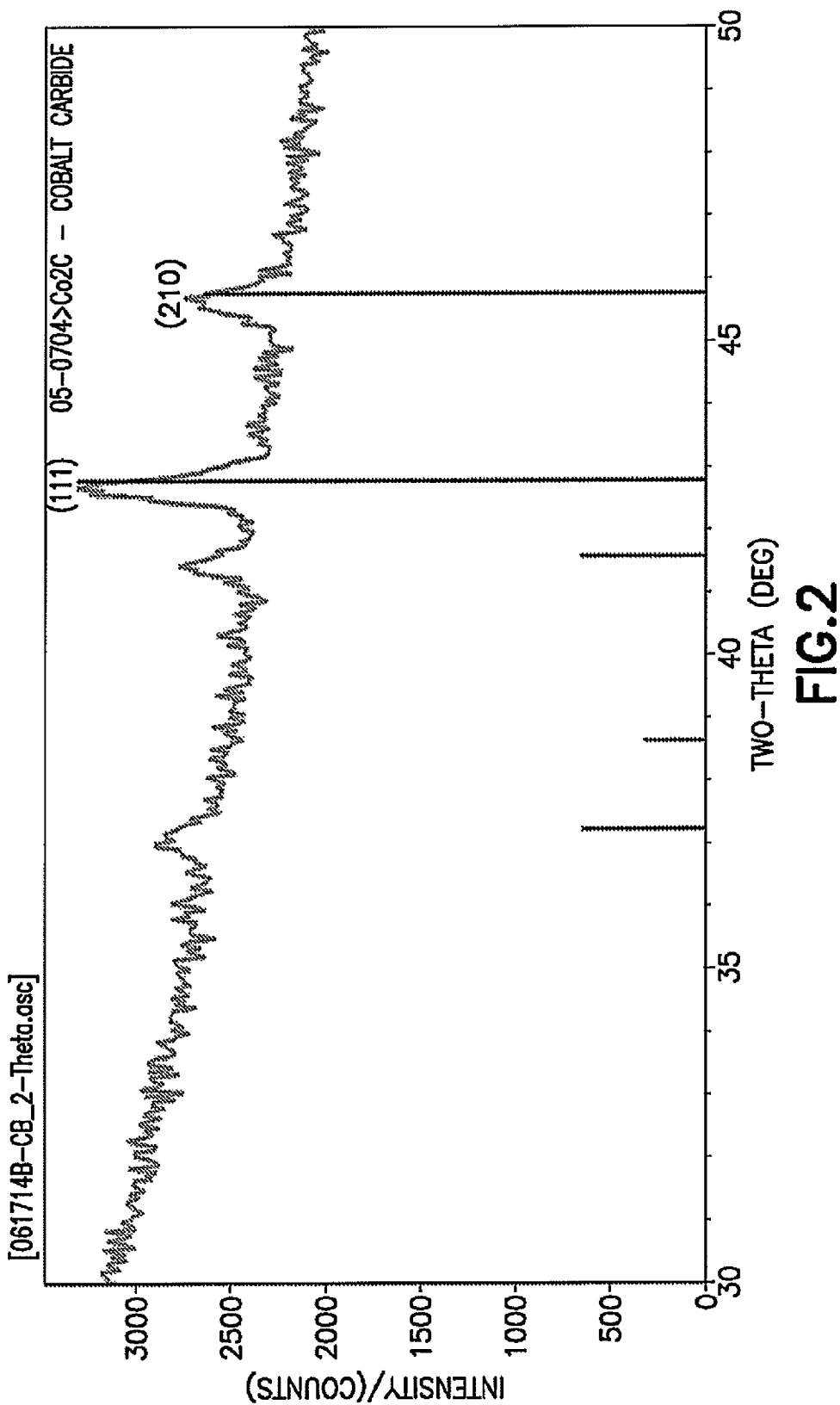
FIG. 2 is an XRD plot for cobalt material deposited on a substrate from a Co(tBuNCHCHNtBu)$_2$ precursor.

The Co(tBuNCHCHNtBu)$_2$ precursor then was evaluated in deposition on silicon dioxide substrates, at the following deposition conditions: 290° C. deposition temperature; 50 µmole/minute delivery rate of the precursor, deposition pressure of 10-30 torr; hydrogen as a co-reactant introduced to the deposition chamber at flow rate of 0.5 to 3 L per minute; vaporizer temperature of 130° C.; and 90° C. deposition chamber temperature. The resulting deposited material was in the form of powdery Co$_2$C material. XRD analysis of such deposited Co$_2$C material identified such material has being orthorhombic in character, as shown by the XRD plot in FIG. 2.

Figure 3:
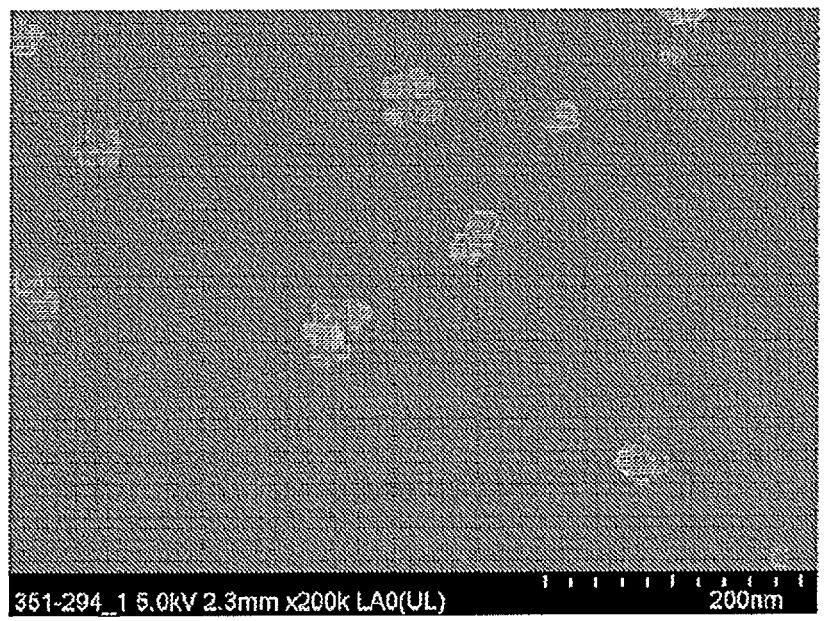
FIG. 3 is a micrograph of deposited cobalt material deposited at a thickness of 25.1 Å and pressure of 30 torr from a Co(tBuNCHCHNtBu)$_2$ precursor.
Figure 4:
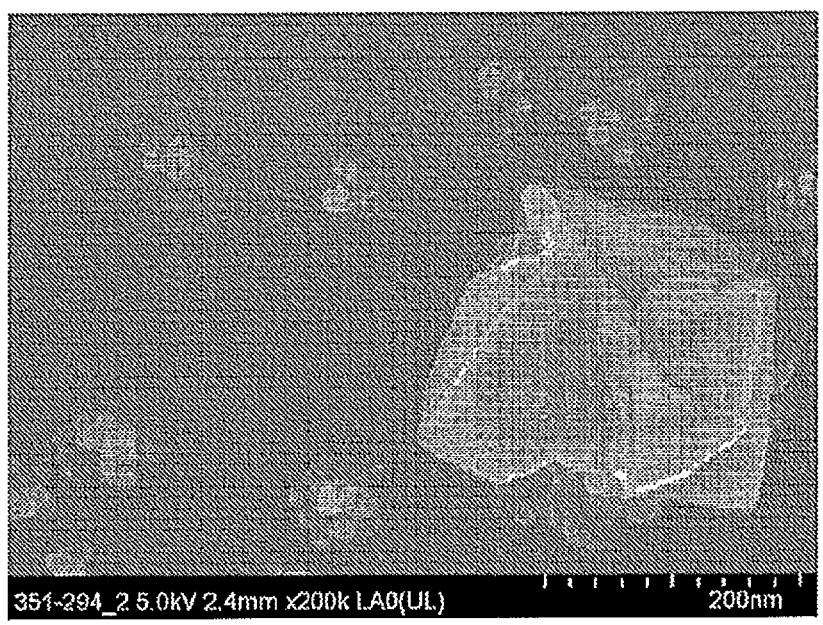
FIG. 4 is a micrograph of deposited cobalt material, deposited at a thickness of 69.7 Å and pressure of 30 torr from a Co(tBuNCHCHNtBu)$_2$ precursor.
Figure 5:
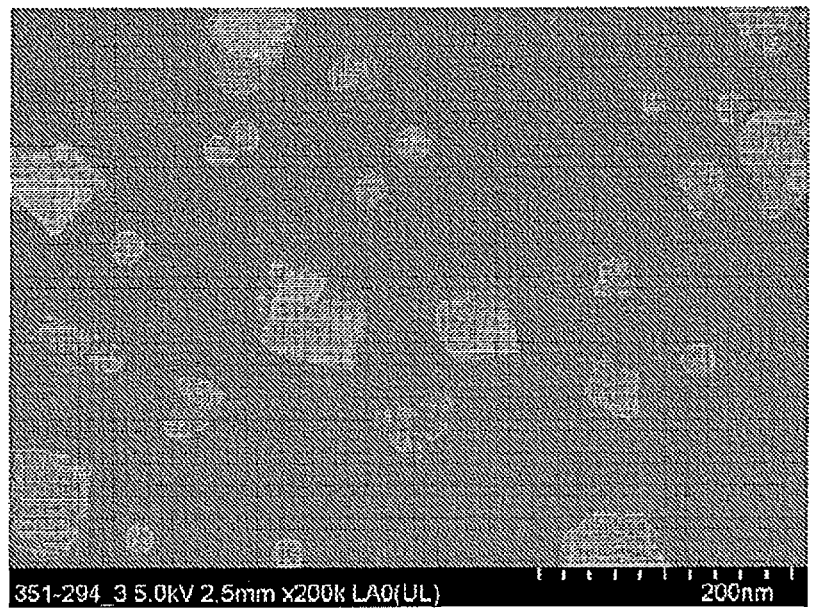
FIG. 5 is a micrograph of deposited cobalt material, deposited at a cobalt thickness of 13.6 Å and pressure of 10 torr from a Co(tBuNCHCHNtBu)$_2$ precursor.
Figure 6:
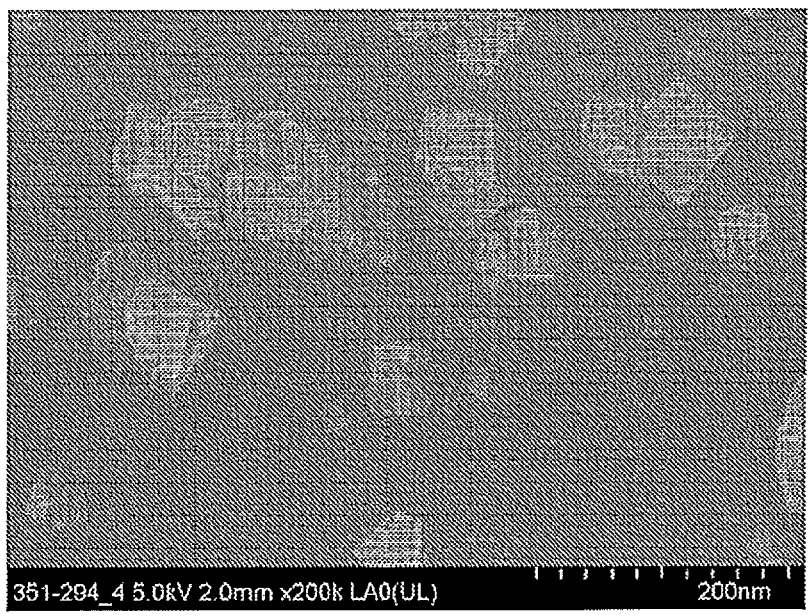
FIG. 6 is a micrograph of deposited cobalt material deposited at a thickness of 59.3 Å and pressure of 10 torr from a Co(tBuNCHCHNtBu)$_2$ precursor.

A micrograph of the deposited Co$_2$C material, deposited at a cobalt thickness of 25.1 Å and pressure of 30 torr is shown in FIG. 3. A micrograph of the deposited Co$_2$C material, deposited at a cobalt thickness of 69.7 Å and pressure of 30 torr is shown in FIG. 4. A micrograph of the deposited Co$_2$C material, deposited at a cobalt thickness of 13.6 Å and pressure of 10 torr is shown in FIG. 5. A micrograph of the deposited Co$_2$C material, deposited at a cobalt thickness of 59.3 Å and pressure of 10 torr is shown in FIG. 6.

Figure 7:
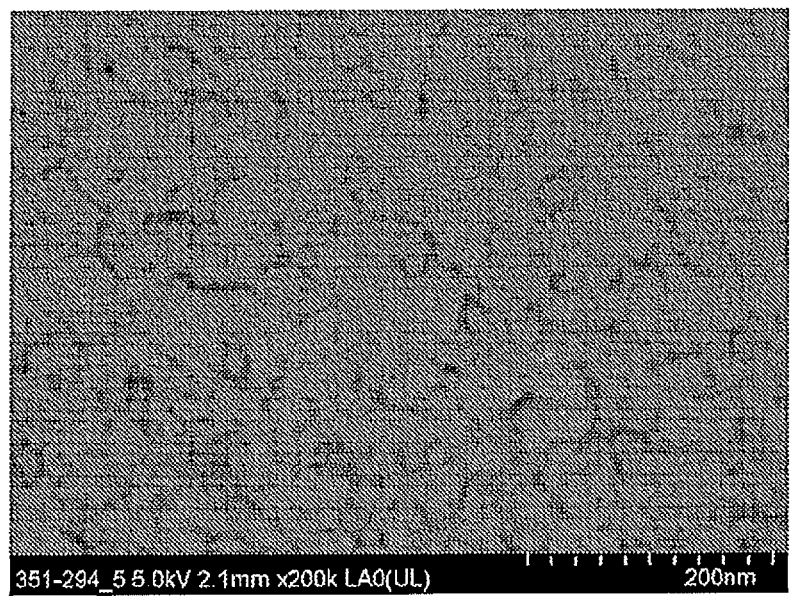
FIG. 7 is a micrograph of a cobalt film formed on a ruthenium substrate at a deposition pressure of 10 torr.

The Co(tBuNCHCHNtBu)$_2$ precursor next was deposited on ruthenium substrates at temperature of 290° C. and precursor flow-rate of 50 µmole/minute, with hydrogen as a co-flow gas delivered to the deposition chamber with the precursor. FIG. 7 is a micrograph of a cobalt film formed on the ruthenium substrate at a deposition pressure of 10 torr. The thickness of the cobalt film was determined for this sample by x-ray fluorescence and scanning electron micrography, yielding an XRF-determined thickness of 16.6 nm, and an SEM-determined thickness of 22 nm. The resistivity of the cobalt film was determined to be on the order of 59 µΩ-cm.

Substrate effects were evaluated for the Co(tBuNCHCHNtBu)$_2$ precursor deposited that temperature of 290° C., pressure of 30 torr, and with flow of hydrogen as a co-reactant at flow rate of 0.5 L per minute. The results are shown in Table 3 below.

TABLE 3

| Substrate | Sheet R ($\Omega/\square$) | 290 C. Sheet R ($\Omega/\square$) | Dep Sheet R ($\Omega/\square$) | XRF Thickness (A) | Cal Sheet R ($\Omega/\square$) | Resistivity (µΩ-cm) | XRD |
|---|---|---|---|---|---|---|---|
| TaN | 8.9 | 9.1 | 9.45 | 188.3 | −246.38 | −463.93 |  |
| Ta | 8.95 | 8.9 | 9.05 | 124.6 | −526.61 | −656.16 |  |

TABLE 3-continued

| Substrate | Sheet R (Ω/□) | 290 C. Sheet R (Ω/□) | Dep Sheet R (Ω/□) | XRF Thickness (Å) | Cal Sheet R (Ω/□) | Resistivity (μΩ-cm) | XRD |
|---|---|---|---|---|---|---|---|
| TiN | 40.2 | 44.2 | 37.78 | 180.1 | 260.11 | 468.45 | |
| Cu | 0.22 | 0.19 | 0.20 | 230.4 | −3.60 | −8.28 | Amorphous |
| PVD W | 5.74 | 5.52 | 4.92 | 206.5 | 45.01 | 92.95 | |
| CVD W | 0.43 | 0.428 | 0.42 | 155.6 | 26.51 | 41.25 | |
| IrO2 | 29.85 | 27 | 14.49 | 204.1 | 31.27 | 63.83 | |
| Ru-2 | 9.5 | 8.6 | 6.99 | 163.4 | 37.31 | 60.96 | |
| FFW | open | open | 43.94 | 208.7 | 43.94 | 91.70 | |

Sheet resistance, in ohms/square, and resistivity in μΩ-cm, are tabulated in Table 3, along with cobalt film thickness in Ångströms, as determined by x-ray fluorescence, for a variety of substrates including tantalum nitride, tantalum, titanium nitride, copper, tungsten deposited by physical vapor deposition, tungsten deposited by chemical vapor deposition, iridium dioxide, ruthenium, and fluorine free tungsten (FFW).

Figure 8:
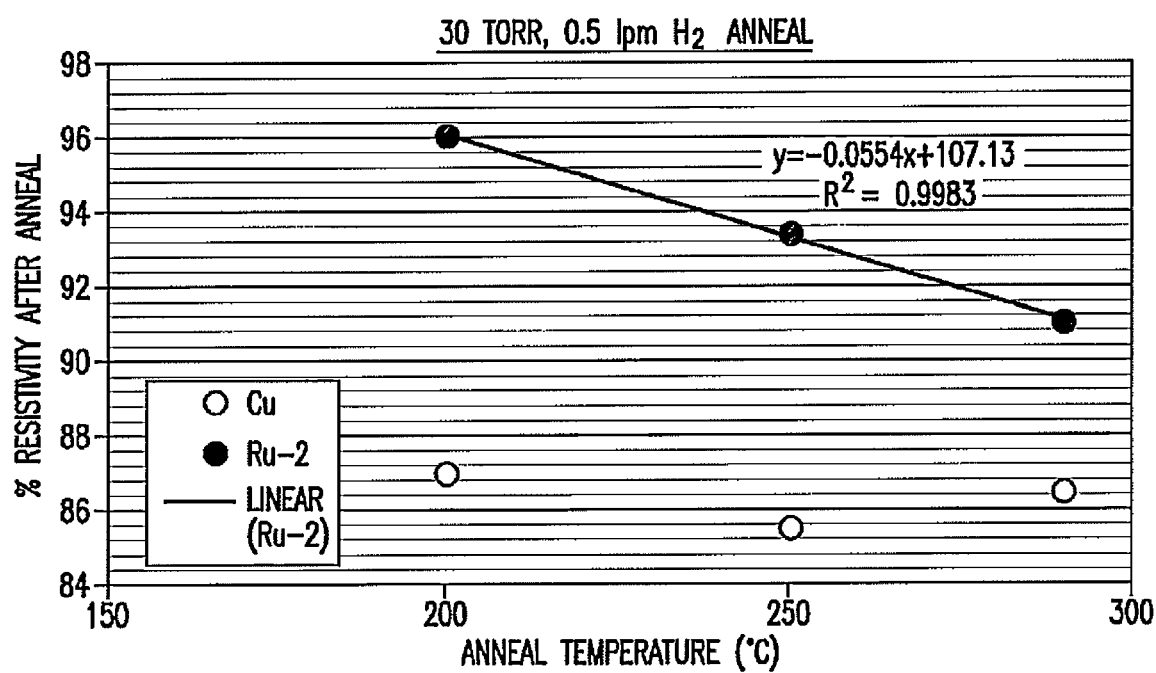
FIG. 8 is a plot of percentage resistivity after annealing, as a function of annealing temperature, in degrees Centigrade, for annealing carried out at a pressure of 30 torr and hydrogen flow-rate of 0.5 L per minute for a cobalt film formed from a Co(tBuNCHCHNtBu)$_2$ precursor.

The effects of annealing on substrate resistivity were then determined for cobalt deposited from the Co(tBuNCHCHNtBu)$_2$ precursor on copper and ruthenium substrates. Results are shown in FIG. 8, as a plot of percentage resistivity after annealing, as a function of annealing temperature, in degrees Centigrade, for annealing carried out at a pressure of 30 torr and hydrogen flow rate of 0.5 L per minute. The percentage of resistivity after annealing was a linear function of annealing temperature, over the temperature range of from 200° C. to 280° C.

Figure 9:
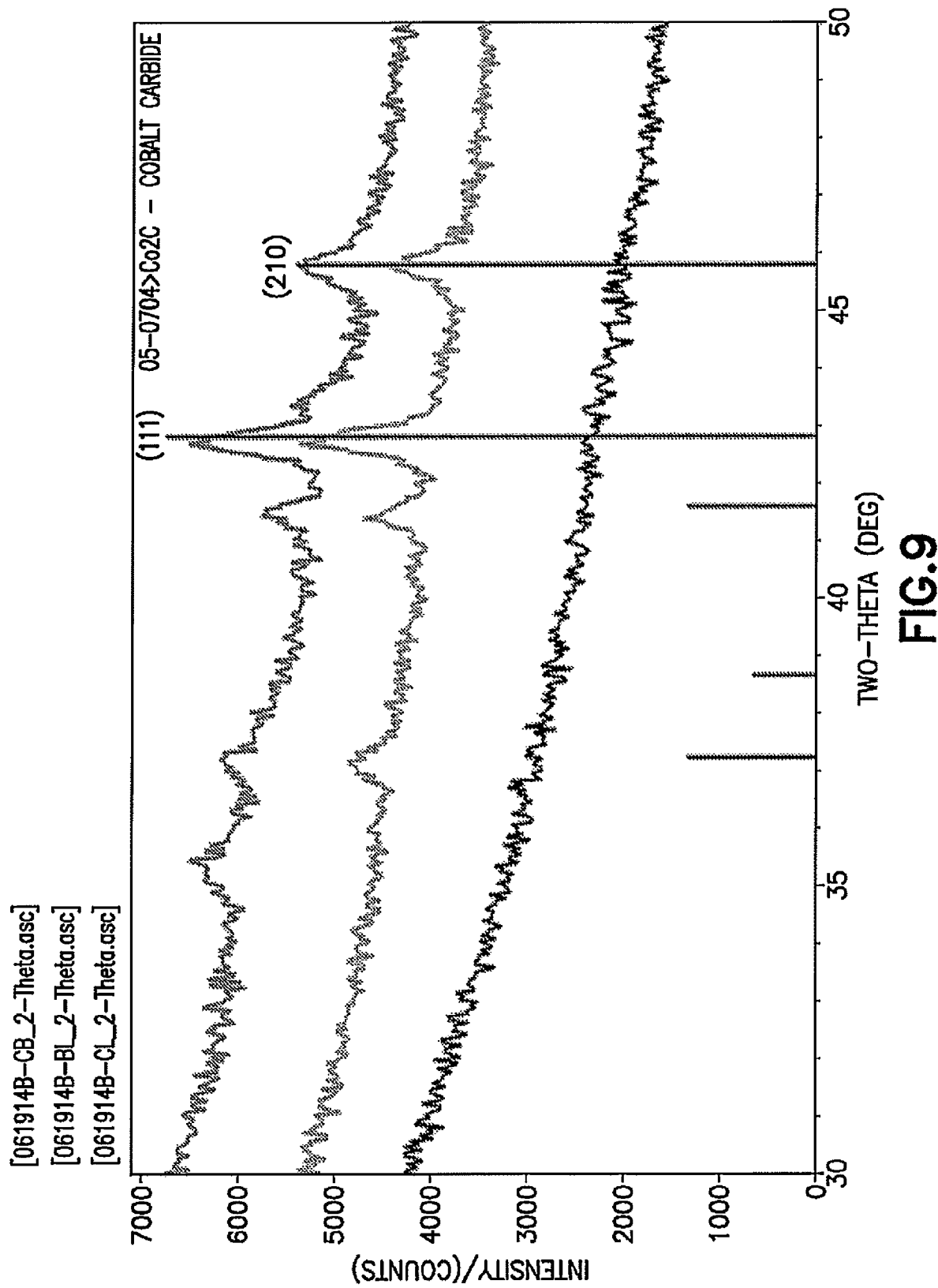
FIG. 9 shows XRD plots for the cobalt films on tantalum nitride, titanium nitride, and copper substrates, in intensity (arbitrary units) as a function of the two-theta angle, in degrees.

FIG. 9 shows XRD plots for the cobalt films on tantalum nitride (upper trace), titanium nitride (middle trace), and copper (lower trace) substrates, in intensity (arbitrary units) as a function of the two-theta angle, in degrees. This plot shows that cobalt was deposited on the copper substrate in an amorphous state.

Figure 10:
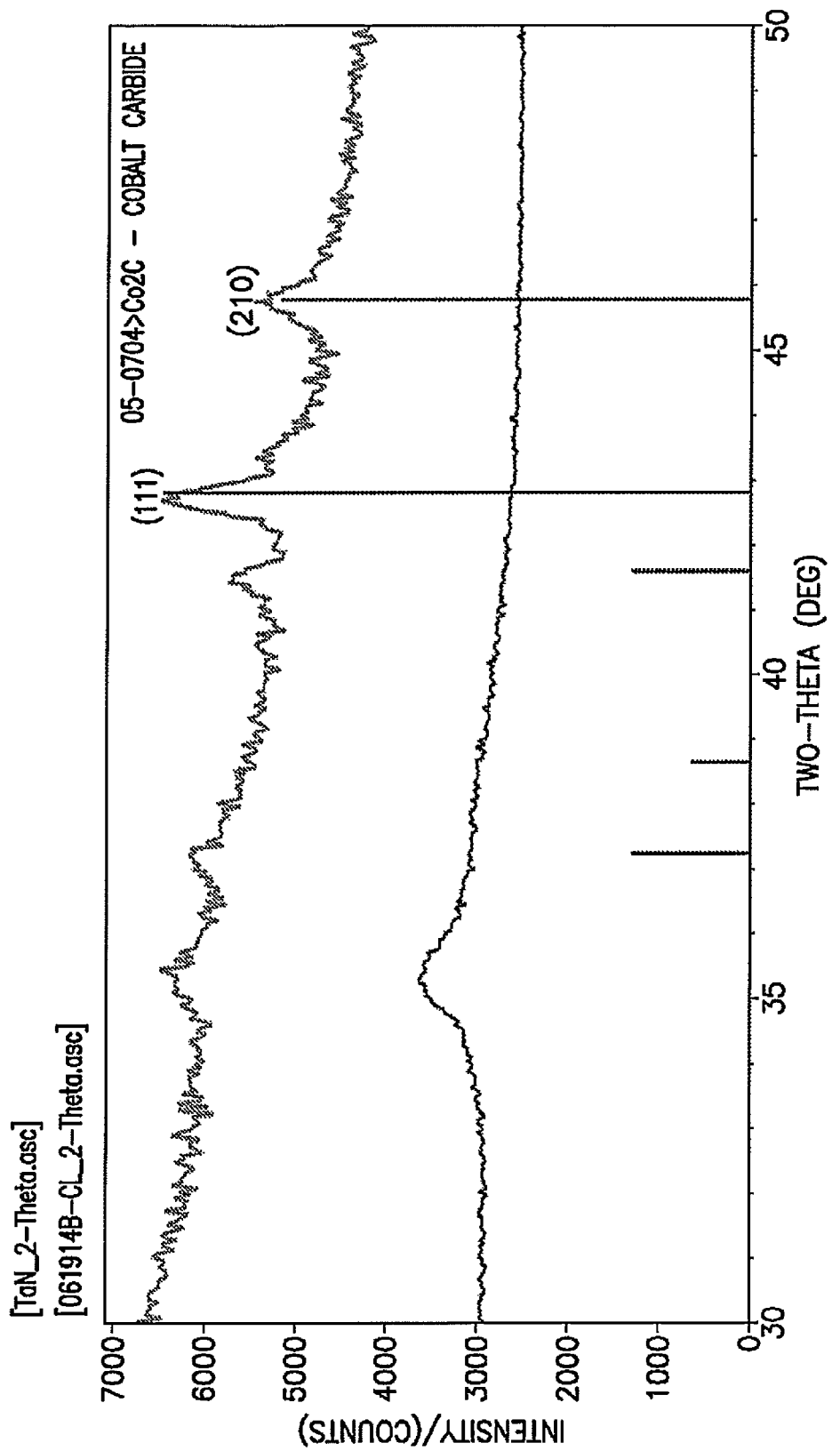
FIG. 10 is an XRD plot of a cobalt film deposited from the Co(tBuNCHCHNtBu)$_2$ precursor on a tantalum nitride substrate, in arbitrary intensity units as a function of the two-theta angle, in degrees.

FIG. 10 is an XRD plot of a cobalt film deposited from the Co(tBuNCHCHNtBu)$_2$ precursor on a tantalum nitride substrate, in arbitrary intensity units as a function of the two-theta angle, in degrees. The tantalum nitride substrate is shown as the lower trace in this plot.

Figure 11:
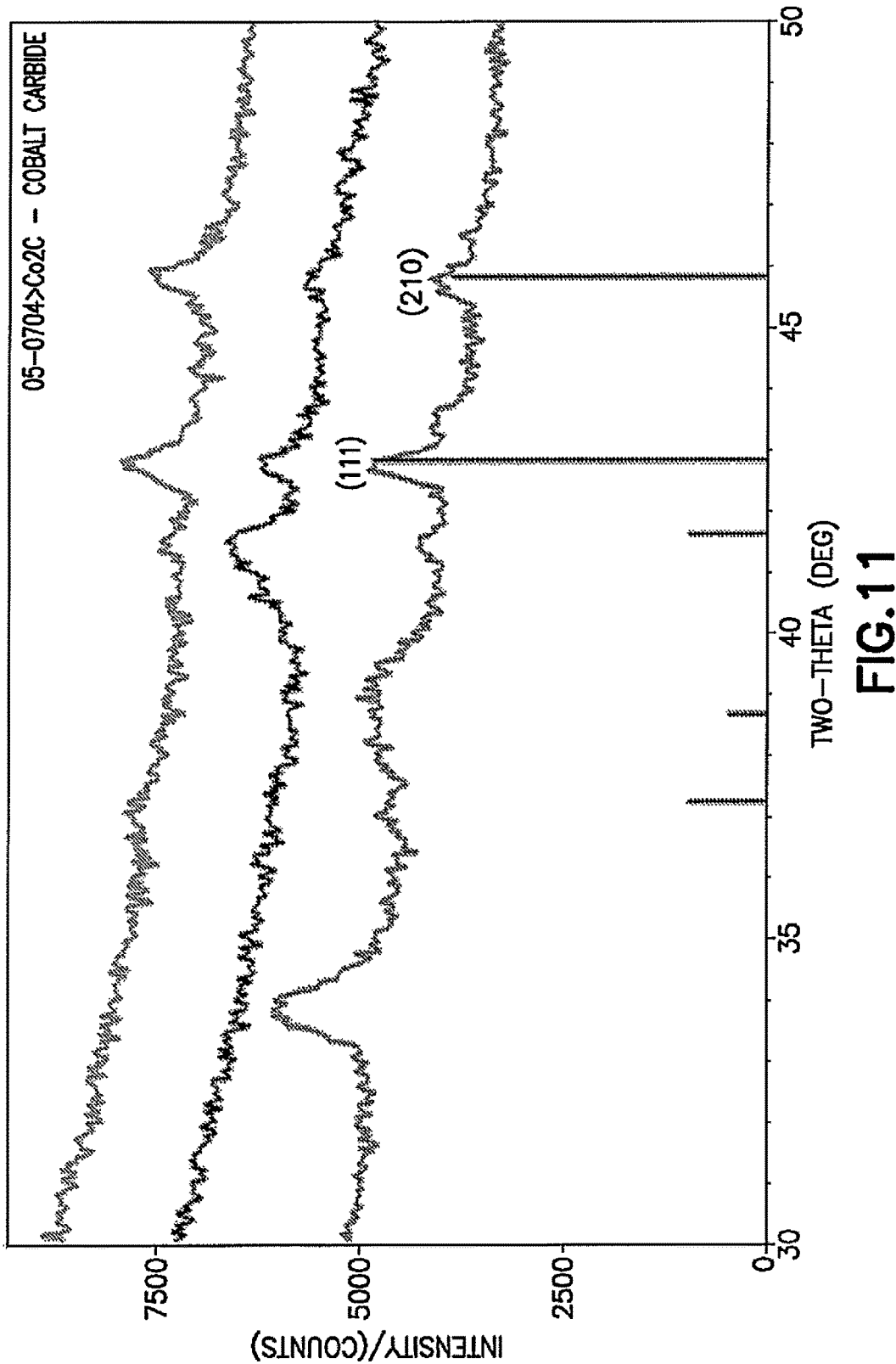
FIG. 11 is an XRD plot of a cobalt film deposited from the Co(tBuNCHCHNtBu)$_2$ precursor, in arbitrary intensity units as a function of the two-theta angle, in degrees. The cobalt film trace on a tungsten nitride (WN) substrate in this plot is the upper trace, the cobalt film trace on an iridium substrate is the middle trace, and the cobalt film trace on a tantalum substrate is the lower trace.

FIG. 11 is an XRD plot of a cobalt film deposited from the Co(tBuNCHCHNtBu)$_2$ precursor, in arbitrary intensity units as a function of the two-theta angle, in degrees. The cobalt film trace on a fluorine free tungsten (FFW) substrate in this plot is the upper trace, the cobalt film trace on an iridium substrate is the middle trace, and the cobalt film trace on a tantalum substrate is the lower trace.

Figure 12:
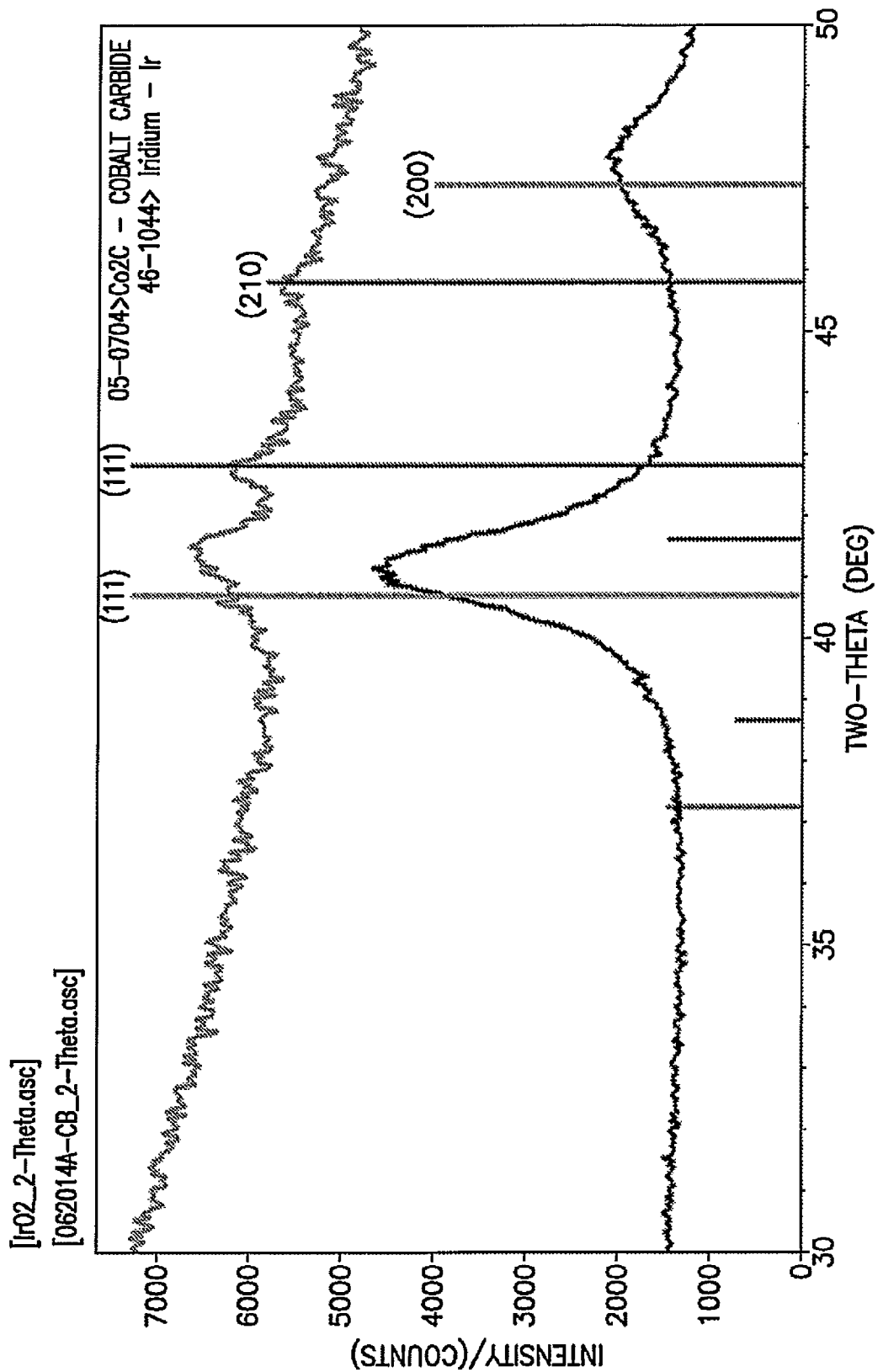
FIG. 12 is an XRD plot of a cobalt film deposited from the Co(tBuNCHCHNtBu)$_2$ precursor on an iridium oxide substrate, in arbitrary intensity units as a function of the two-theta angle, in degrees. The iridium oxide substrate is shown as the lower trace in this plot.

FIG. 12 is an XRD plot of a cobalt film deposited from the Co(tBuNCHCHNtBu)$_2$ precursor on an iridium oxide substrate, in arbitrary intensity units as a function of the two-theta angle, in degrees. The iridium oxide substrate is shown as the lower trace in this plot.

Figure 13:
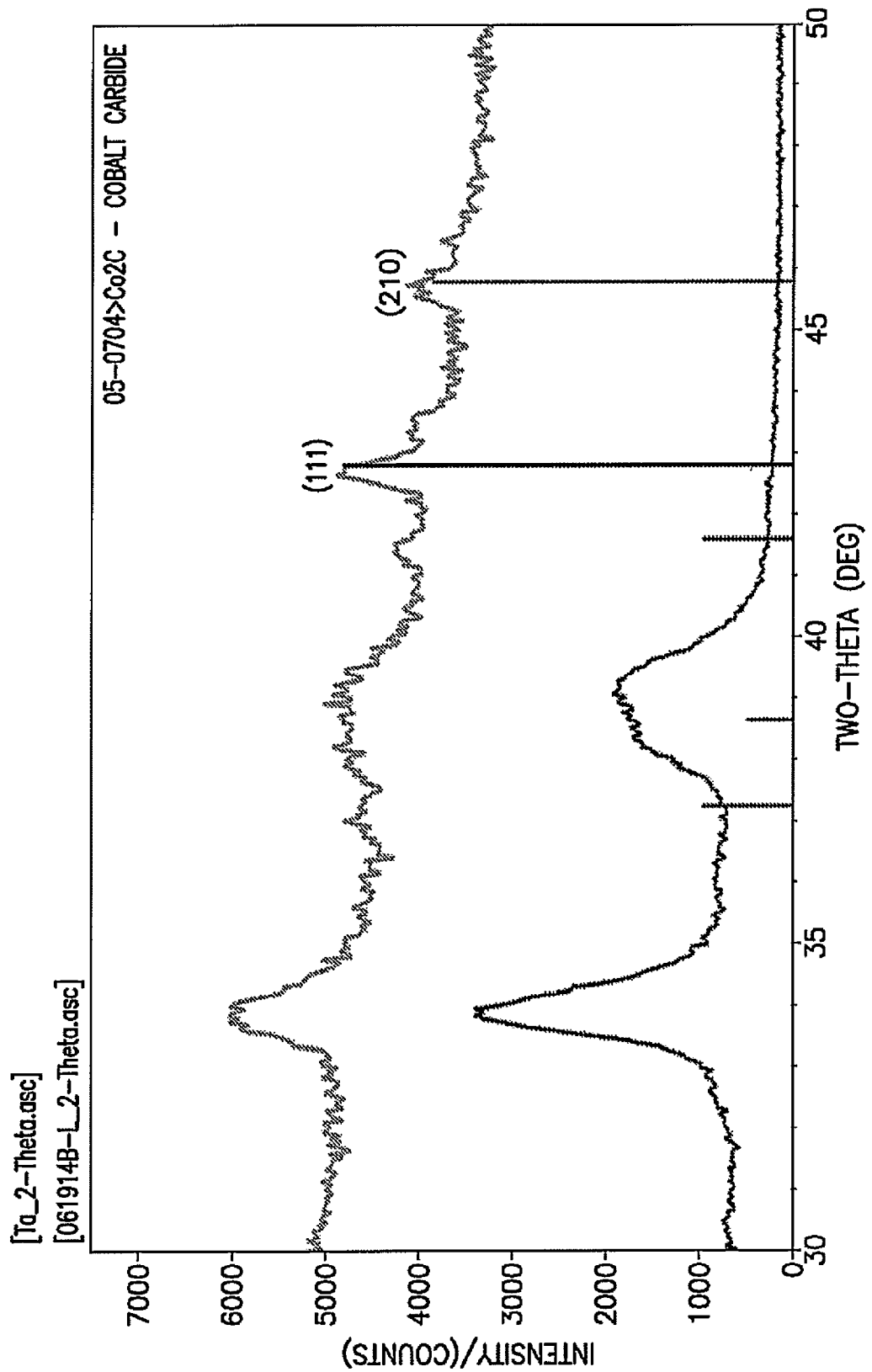
FIG. 13 is an XRD plot of a cobalt film deposited from the Co(tBuNCHCHNtBu)$_2$ precursor on a tantalum substrate, in arbitrary intensity units as a function of the two-theta angle, in degrees. The tantalum substrate is shown as the lower trace in this plot.

FIG. 13 is an XRD plot of a cobalt film deposited from the Co(tBuNCHCHNtBu)$_2$ precursor on a tantalum substrate, in arbitrary intensity units as a function of the two-theta angle, in degrees. The tantalum substrate is shown as the lower trace in this plot.

Figure 14:
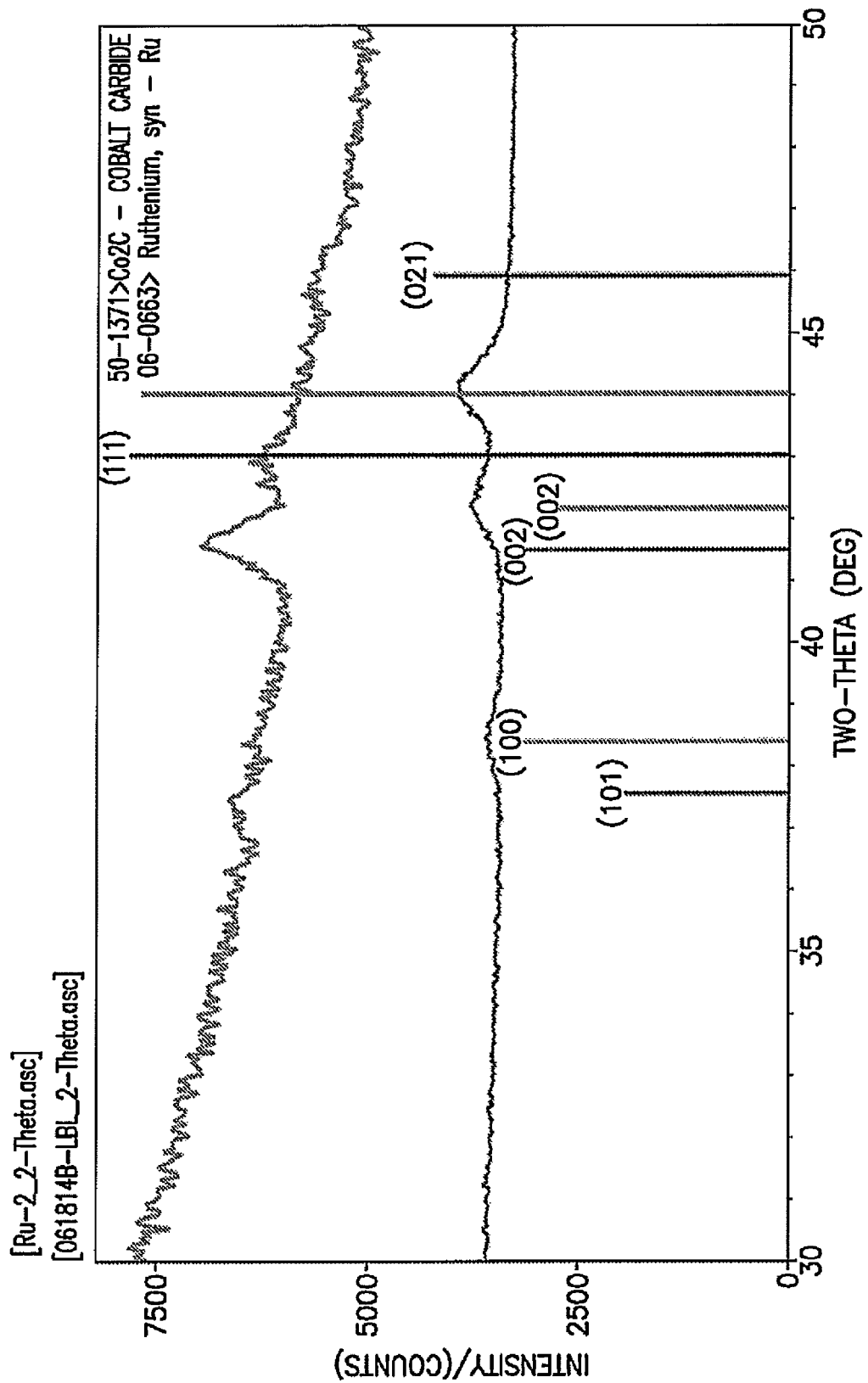
FIG. 14 is an XRD plot of a cobalt film deposited from the Co(tBuNCHCHNtBu)$_2$ precursor on a ruthenium substrate, in arbitrary intensity units as a function of the two-theta angle, in degrees. The ruthenium substrate is shown as the lower trace in this plot.

FIG. 14 is an XRD plot of a cobalt film deposited from the Co(tBuNCHCHNtBu)$_2$ precursor on a ruthenium substrate, in arbitrary intensity units as a function of the two-theta angle, in degrees. The ruthenium substrate is shown as the lower trace in this plot.

Figure 15:
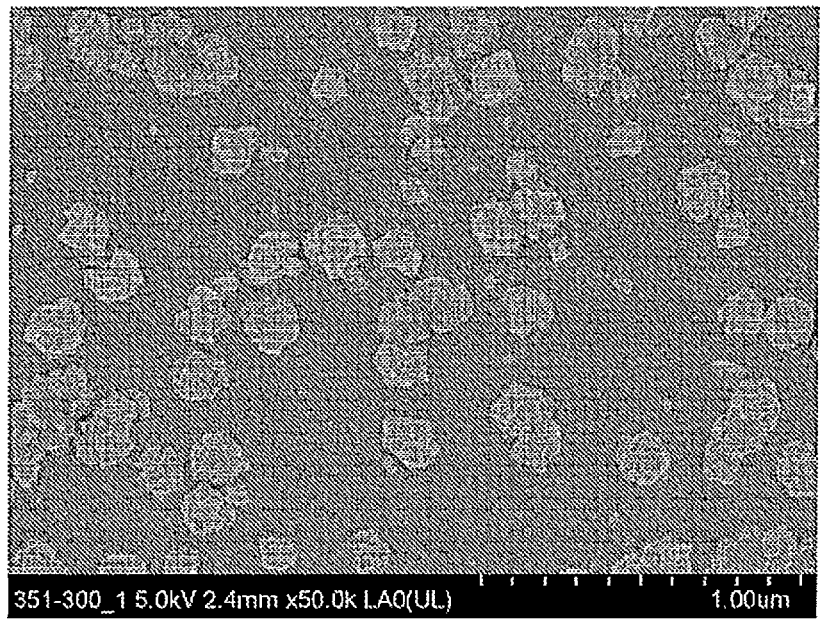
FIG. 15 is a scanning electron micrograph of a cobalt film deposited from the Co(tBuNCHCHNtBu)$_2$ precursor on a tantalum substrate. The cobalt film had a thickness of 124.6 Å.

FIG. 15 is a scanning electron micrograph of a cobalt film deposited from the Co(tBuNCHCHNtBu)$_2$ precursor on a tantalum substrate. The cobalt film had a thickness of 124.6 Å.

Figure 16:
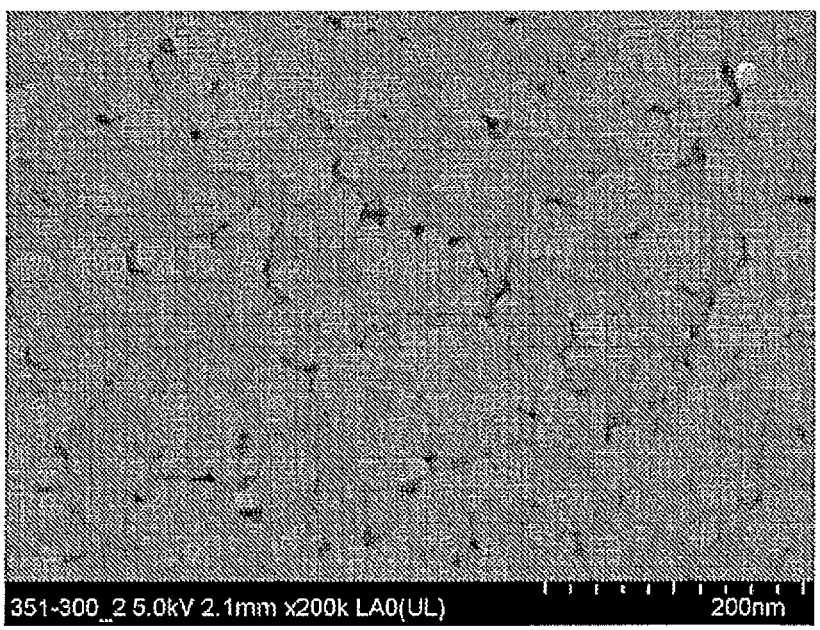
FIG. 16 is a scanning electron micrograph of a cobalt film on a copper substrate, at a cobalt film thickness of 230.4 Å.

FIG. 16 is a scanning electron micrograph of a cobalt film on a copper substrate, at a cobalt film thickness of 230.4 Å.

Figure 17:
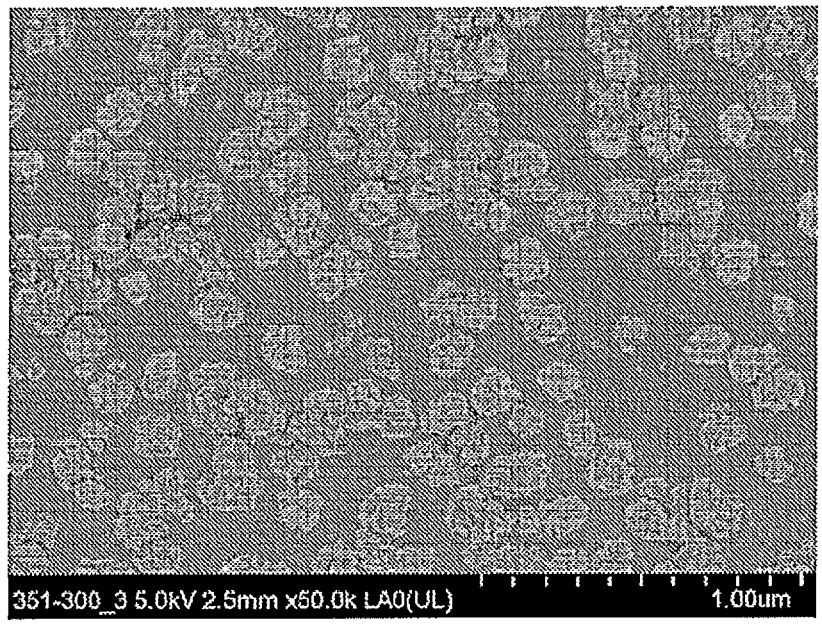
FIG. 17 is a scanning electron micrograph of a cobalt film deposited from the Co(tBuNCHCHNtBu)$_2$ precursor on a tantalum nitride substrate, wherein the cobalt film had a thickness of 188.3 Å.

FIG. 17 is a scanning electron micrograph of a cobalt film deposited from the Co(tBuNCHCHNtBu)$_2$ precursor on a tantalum nitride substrate, wherein the cobalt film had a thickness of 188.3 Å.

Figure 18:
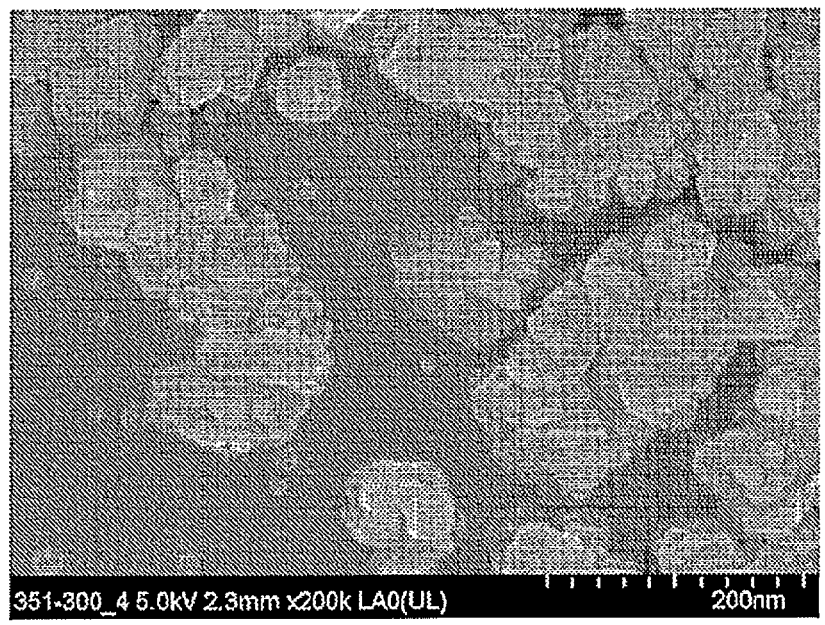
FIG. 18 is a scanning electron micrograph of a cobalt film deposited from the Co(tBuNCHCHNtBu)$_2$ precursor on a titanium nitride substrate, wherein the cobalt film had a thickness of 180.1 Å.

FIG. 18 is a scanning electron micrograph of a cobalt film deposited from the Co(tBuNCHCHNtBu)$_2$ precursor on a titanium nitride substrate, wherein the cobalt film had a thickness of 180.1 Å.

Figure 19:
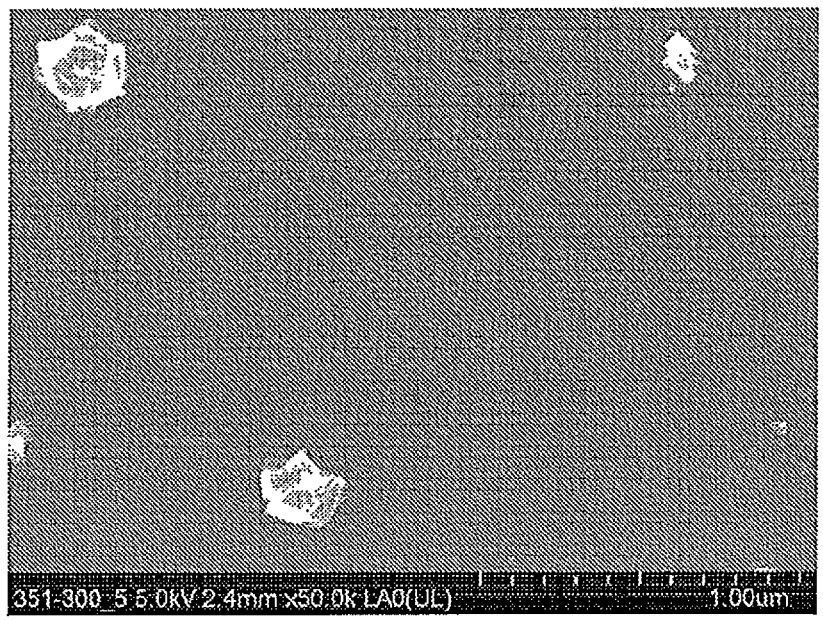
FIG. 19 is a scanning electron micrograph of a cobalt film deposited from the Co(tBuNCHCHNtBu)$_2$ precursor on a silicon substrate, wherein the cobalt film had a thickness of 25.3 Å.

FIG. 19 is a scanning electron micrograph of a cobalt film deposited from the Co(tBuNCHCHNtBu)$_2$ precursor on a silicon substrate, wherein the cobalt film had a thickness of 25.3 Å.

Figure 20:
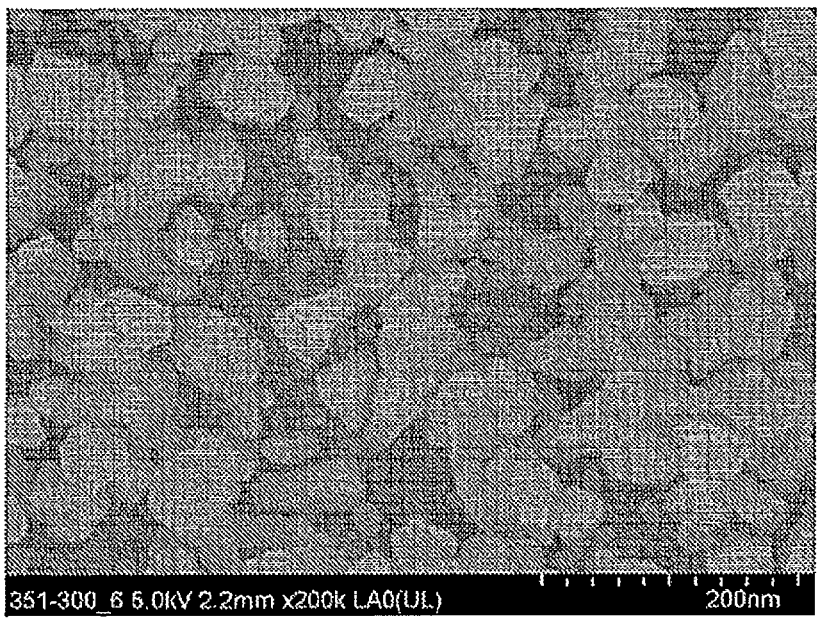
FIG. 20 is a scanning electron micrograph of a cobalt film deposited from the Co(tBuNCHCHNtBu)$_2$ precursor on a fluorine free tungsten (FFW) substrate. The cobalt film thickness was 208.7 Å, and the film had a resistivity of 91.7 μΩ-cm.

FIG. 20 is a scanning electron micrograph of a cobalt film deposited from the Co(tBuNCHCHNtBu)$_2$ precursor on a fluorine free tungsten (FFW) substrate. The cobalt film thickness was 208.7 Å, and the film had a resistivity of 91.7 μΩ-cm.

Figure 21:
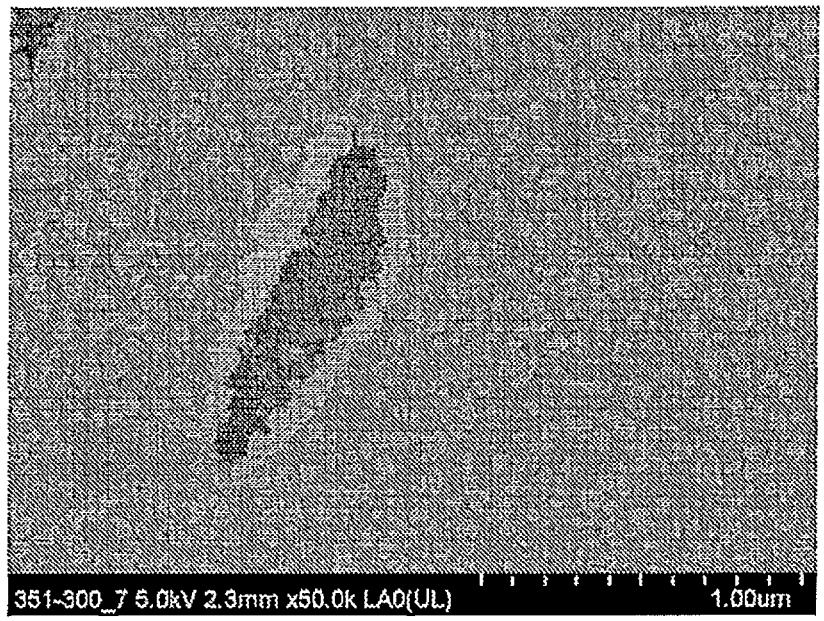
FIG. 21 is a scanning electron micrograph, at 50,000× magnification, of a cobalt film deposited from the Co(tBuNCHCHNtBu)$_2$ precursor on an iridium dioxide substrate. The cobalt film had a thickness of 204.1 Å.

FIG. 21 is a scanning electron micrograph, at 50,000× magnification, of a cobalt film deposited from the Co(tBuNCHCHNtBu)$_2$ precursor on an iridium dioxide substrate. The cobalt film had a thickness of 204.1 Å.

Figure 22:
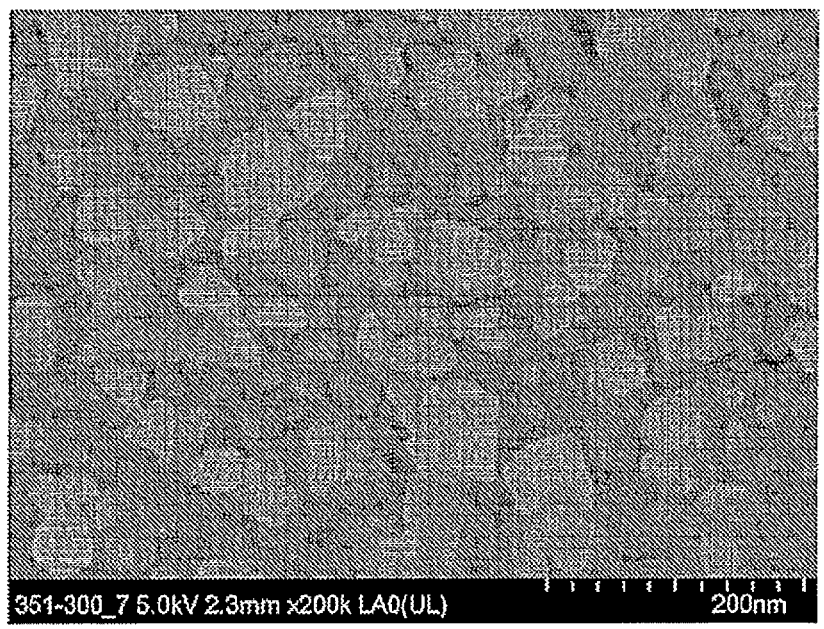
FIG. 22 is a scanning electron micrograph, at 200,000× magnification, of the cobalt film of FIG. 21, deposited from the Co(tBuNCHCHNtBu)$_2$ precursor on an iridium dioxide substrate, wherein the cobalt film had a thickness of 204.1 Å.
Figure 23:
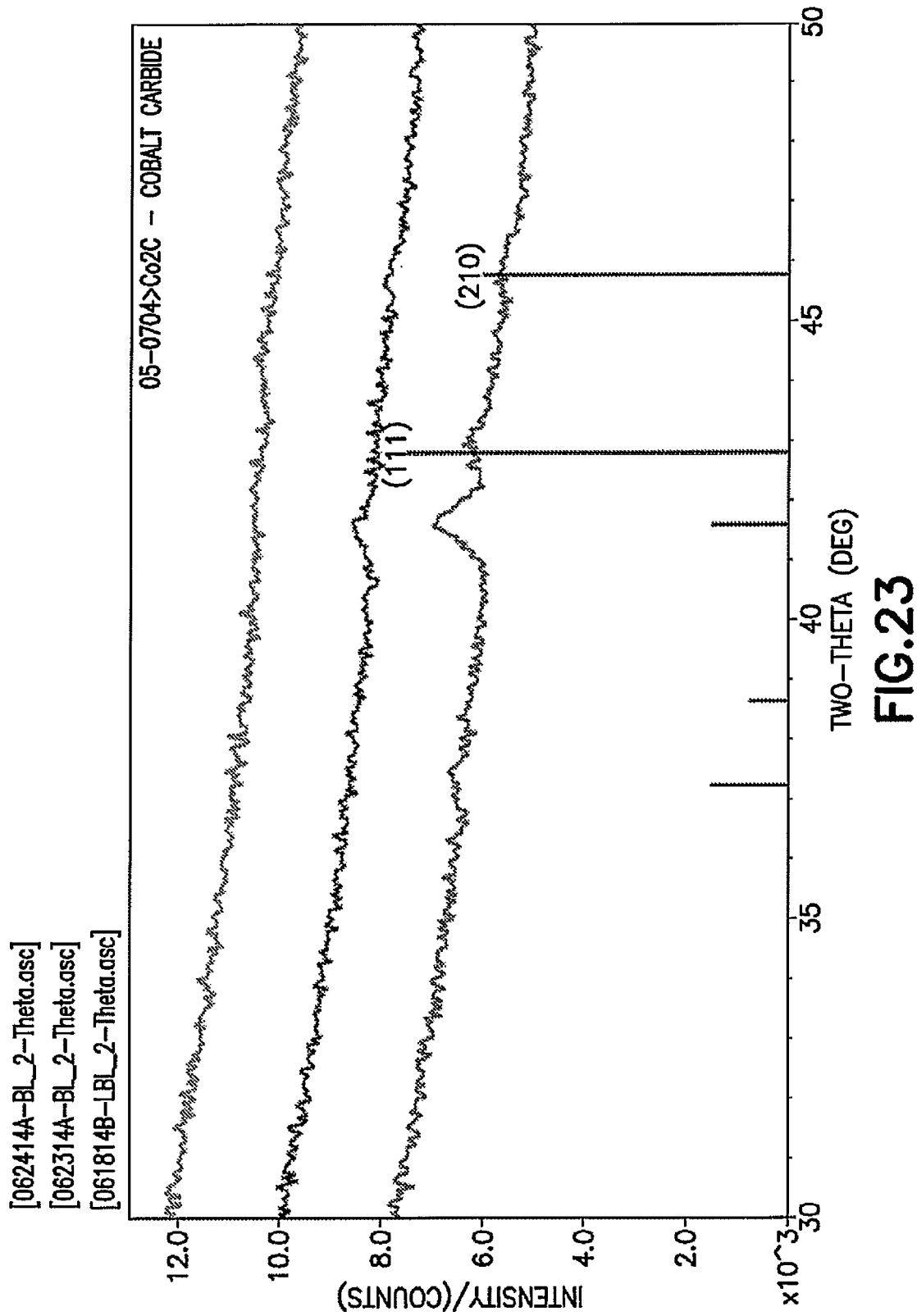
FIG. 23 is an XRD plot of a cobalt film deposited from the Co(tBuNCHCHNtBu)$_2$ precursor on a ruthenium substrate, in arbitrary intensity units as a function of the two-theta angle, in degrees. The lower line in this plot shows the data for deposition at 290° C., and cobalt film thickness of 166 Å. The middle line in this plot shows the data for deposition at 250° C., and cobalt film thickness of 205.1 Å. The upper line in this plot shows the data for deposition at 200° C., and cobalt film thickness of 211.8 Å.

FIG. 22 is a scanning electron micrograph, at 200,000× magnification, of the cobalt film of FIG. 23, deposited from the Co(tBuNCHCHNtBu)$_2$ precursor on an iridium dioxide substrate, wherein the cobalt film had a thickness of 204.1 Å.

Substrate effects were determined for cobalt films deposited from the Co(tBuNCHCHNtBu)$_2$ precursor on tantalum nitride, tantalum, copper, ruthenium, fluorine-free tungsten, and silicon dioxide substrates. The cobalt film deposition was carried out at 250° C., pressure of 30 torr, and hydrogen co-reactant flow rate of 0.5 L per minute. The results are shown in Table 6 below.

TABLE 4

| Substrate | Sheet R (Ω/□) | 250 C. Sheet R (Ω/□) | Dep Sheet R (Ω/□) | XRF Thickness (Å) | Cal Sheet R (Ω/□) | Resistivity (μΩ-cm) | XRD |
|---|---|---|---|---|---|---|---|
| TaN | | | | | 0.8 | | |
| Ta | | | | | 4.4 | | |
| Cu | 0.215 | 0.184 | 0.1974 | 121 | −2.71 | −3.3 | Amorphous |
| Ru-2 | 9.6 | 8.96 | 6.481 | 205.1 | 23.42 | 48.0 | |

TABLE 4-continued

| Substrate | Sheet R ($\Omega/\square$) | 250 C. Sheet R ($\Omega/\square$) | Dep Sheet R ($\Omega/\square$) | XRF Thickness (A) | Cal Sheet R ($\Omega/\square$) | Resistivity ($\mu\Omega$-cm) | XRD |
|---|---|---|---|---|---|---|---|
| FFW | open | open | 60.74 | 127.4 | 60.74 | 77.4 | |
| SiO2 | | | | 3.6 | | | |

Resistivity and sheet resistance were evaluated for substrate effects, for cobalt films deposited from the Co(t-BuNCHCHNtBu)$_2$ precursor on copper, ruthenium, fluorine-free tungsten, and ultra-low dielectric constant (ULK) material substrates. The deposition was carried out at 200° C., pressure of 30 torr, and hydrogen co-reaction flow rate of 0.5 L per minute. The results are shown in Table 7 below.

nitride substrate, at a temperature of 250° C., and precursor flow rate of 50 µmole/minute. A first run was carried out at pressure of 10 torr, and co-reactant hydrogen flow rate of 3 L per minute. A second run was carried out at pressure of 30 torr, and hydrogen co-reactant flow rate of 0.5 L per minute. A third run was carried out at pressure of 30 torr, and hydrogen co-reactant flow rate of 3 L per minute. A fourth

TABLE 5

| Substrate | Sheet R ($\Omega/\square$) | 200 C. Sheet R ($\Omega/\square$) | Dep Sheet R ($\Omega/\square$) | XRF Thickness (A) | Cal Sheet R ($\Omega/\square$) | Resistivity ($\mu\Omega$-cm) | XRD |
|---|---|---|---|---|---|---|---|
| FFW | open | | open | 31.5 | | | |
| FFW | open | | open | 30.7 | | | |
| Cu | 0.2421 | 0.2324 | 0.2228 | 169.5 | 5.39 | 9.14 | Amorphous |
| Ru-2 | 9.173 | 8.01 | 5.757 | 211.8 | 20.47 | 43.35 | |
| FFW | open | open | open | 27.5 | | 0 | |
| ULK | | | | 0 | | | |
| FFW | open | | 10745000 | 60.1 | | 6457745 | |
| FFW | open | | 1832800 | 49.8 | | 912734 | |
| Cu | 0.2142 | 0.186354 | 0.2228 | 349.9 | −1.14 | −4 | Amorphous |
| Ru-2 | 8.894 | 8.53824 | 4.255 | 396.8 | 8.48 | 34 | |
| FFW | open | open | 11896000 | 50.3 | | 5983688 | |
| ULK | | | | 0 | | | |

FIG. 23 is an XRD plot of a cobalt film deposited from the Co(tBuNCHCHNtBu)$_2$ precursor on a ruthenium substrate, in arbitrary intensity units as a function of the two-theta angle, in degrees. The lower line in this plot shows the data for deposition at 290° C., and cobalt film thickness of 166 Å. The middle line in this plot shows the data for deposition at 250° C., and cobalt film thickness of 205.1 Å. The upper line in this plot shows the data for deposition at 200° C., and cobalt film thickness of 211.8 Å.

Figure 24:
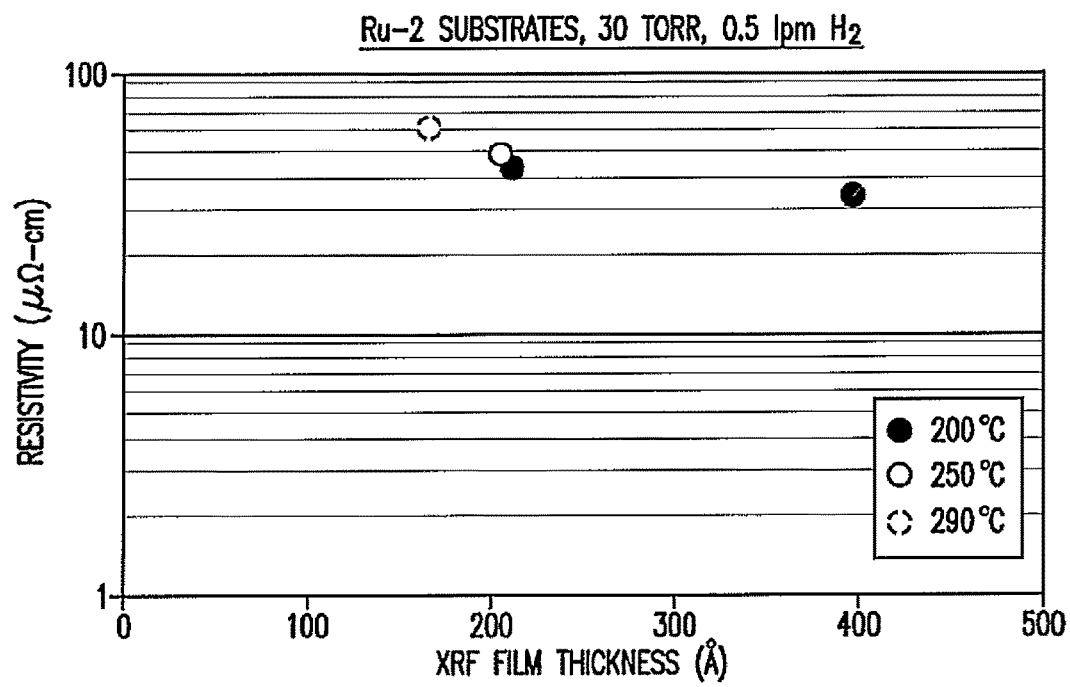
FIG. 24 is a graph of resistivity, in μΩ-cm, as a function of film thickness in Ångströms, as determined by x-ray fluorescence, for a cobalt film deposited from the Co(t-BuNCHCHNtBu)$_2$ precursor on a ruthenium substrate, showing the data for deposition at a temperature of 200° C., 250° C., and 290° C. The data show that the cobalt film had a resistivity on the order of 30 μΩ-cm.

FIG. 24 is a graph of resistivity, in µΩ-cm, as a function of film thickness in Ångströms, as determined by x-ray fluorescence, for a cobalt film deposited from the Co(t-BuNCHCHNtBu)$_2$ precursor on a ruthenium substrate, showing the data for deposition at a temperature of 200° C., 250° C., and 290° C. The data show that the cobalt film had a resistivity on the order of 30 µΩ-cm.

FIG. 25 is an XRD plot of a cobalt film deposited from the Co(tBuNCHCHNtBu)$_2$ precursor on a fluorine-free tungsten substrate, in arbitrary intensity units as a function of the two-theta angle, in degrees. The upper line in this plot shows the data for deposition at 290° C., and cobalt film thickness of 208.7 Å. The lower line in this plot shows the data for deposition at 250° C., and cobalt film thickness of 127.4 Å.

Figure 26:
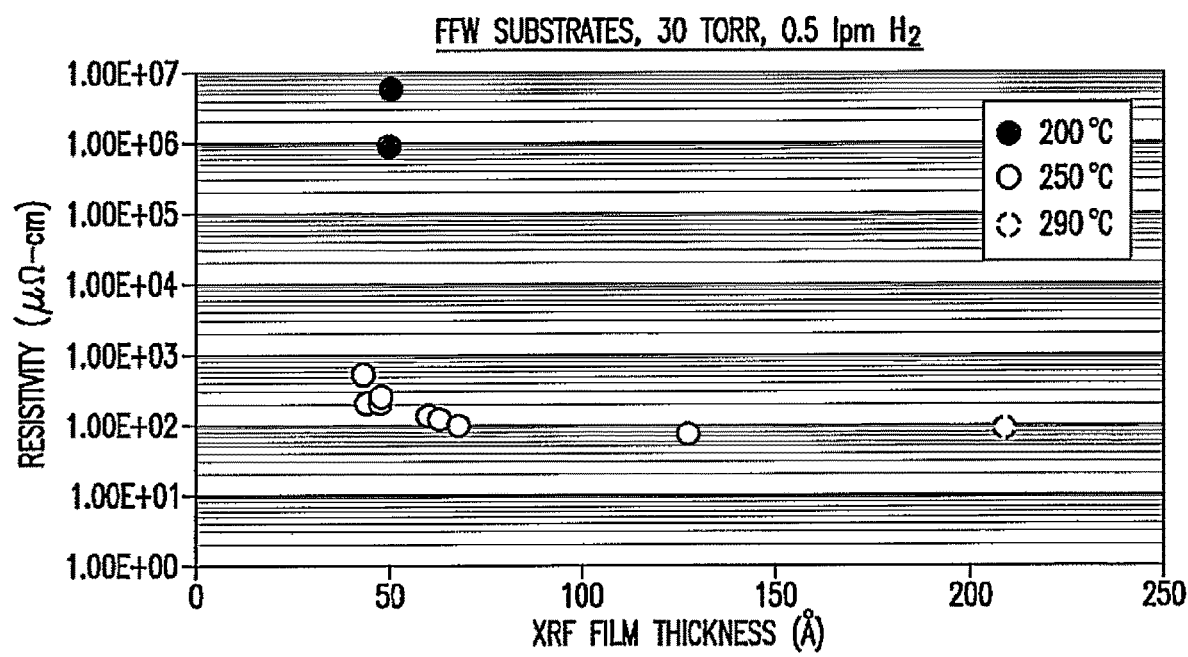
FIG. 26 is a graph of resistivity, in μΩ-cm, as a function of film thickness in Ångströms, as determined by x-ray fluorescence, for a cobalt Film deposited from the Co(t-BuNCHCHNtBu)$_2$ precursor on a fluorine-free tungsten nitride substrate, at temperatures of 200° C., 250° C., and 290° C. The deposition was carried out at pressure of 30 torr, and with hydrogen co-reactant flow rate of 0.5 L per minute.

FIG. 26 is a graph of resistivity, in µΩ-cm, as a function of film thickness in Ångströms, as determined by x-ray fluorescence, for a cobalt film deposited from the Co(t-BuNCHCHNtBu)$_2$ precursor on a fluorine-free tungsten nitride substrate, at temperatures of 200° C., 250° C., and 290° C. The deposition was carried out at pressure of 30 torr, and with hydrogen co-reactant flow rate of 0.5 L per minute.

Figure 27:
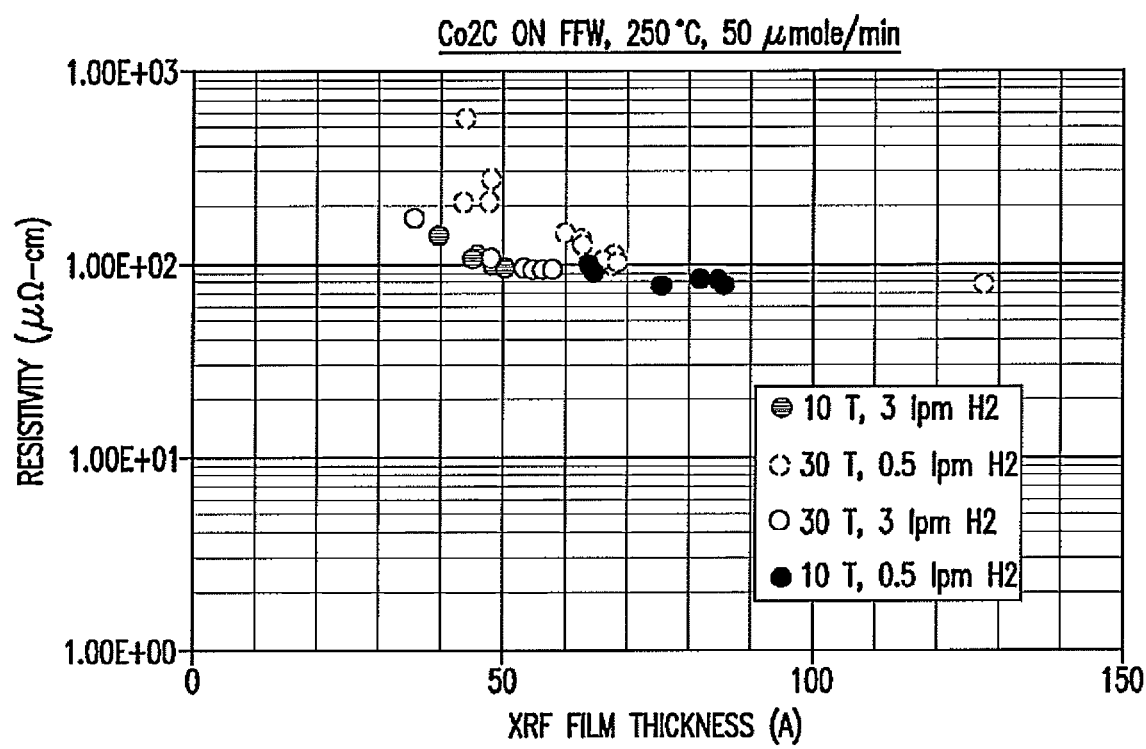
FIG. 27 is a graph of resistivity, in μΩ-cm, as a function of film thickness in Ångströms, as determined by x-ray fluorescence, for a cobalt film deposited from the Co(t-BuNCHCHNtBu)$_2$ precursor on a fluorine-free tungsten nitride substrate, at a temperature of 250° C., and precursor flow rate of 50 μmole/minute. A first run was carried out at pressure of 10 torr, and co-reactant hydrogen flow rate of 3 L per minute. A second run was carried out at pressure of 30 torr, and hydrogen co-reactant flow rate of 0.5 L per minute. A third run was carried out at pressure of 30 torr, and hydrogen co-reactant flow rate of 3 L per minute. A fourth run was carried out at pressure of 10 torr, and hydrogen co-reactant flow rate of 0.5 L per minute.

FIG. 27 is a graph of resistivity, in µΩ-cm, as a function of film thickness in Ångströms, as determined by x-ray fluorescence, for a cobalt film deposited from the Co(t-BuNCHCHNtBu)$_2$ precursor on a fluorine-free tungsten run was carried out at pressure of 10 torr, and hydrogen co-reactant flow rate of 0.5 L per minute.

The foregoing data showed that the bulk resistivity of the cobalt film, over a film thickness range of from 50 to 130 Å, was in a range of from about 75 µΩ-cm to about 150 µΩ-cm, at deposition temperature of 250° C., deposition pressure of 30 torr, and 0.5 L per minute of hydrogen co-reactant flow.

Figure 28:
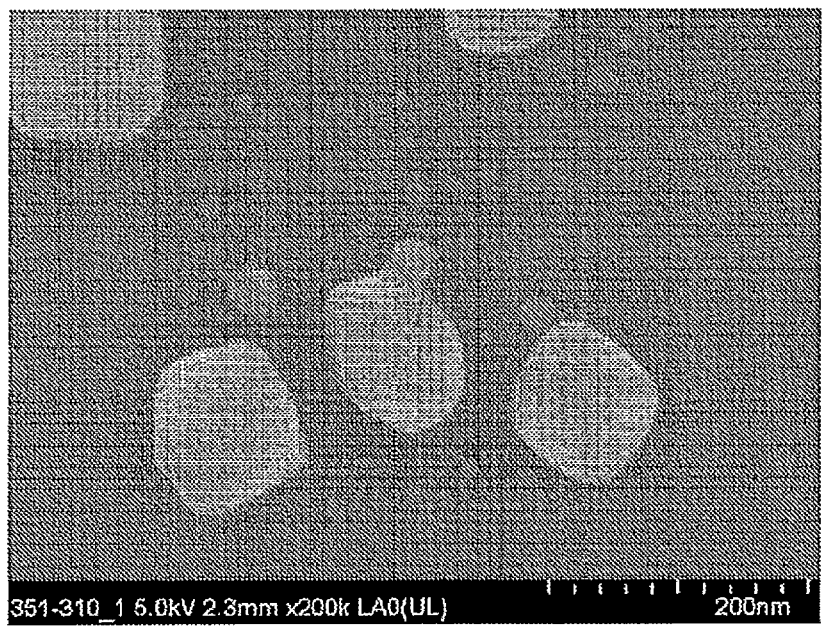
FIG. 28 is a scanning electron micrograph of a cobalt film deposited from the Co(tBuNCHCHNtBu)$_2$ precursor on a fluorine-free tungsten substrate, in which the film was deposited at temperature of 200° C., pressure of 30 torr, co-reactant hydrogen flow of 0.5 L per minute, yielding a cobalt film thickness of 49.8 Å.

FIG. 28 is a scanning electron micrograph of a cobalt film deposited from the Co(tBuNCHCHNtBu)$_2$ precursor on a fluorine-free tungsten substrate, in which the film was deposited at temperature of 200° C., pressure of 30 torr, co-reactant hydrogen flow of 0.5 L per minute, yielding a cobalt film thickness of 49.8 Å.

Figure 29:
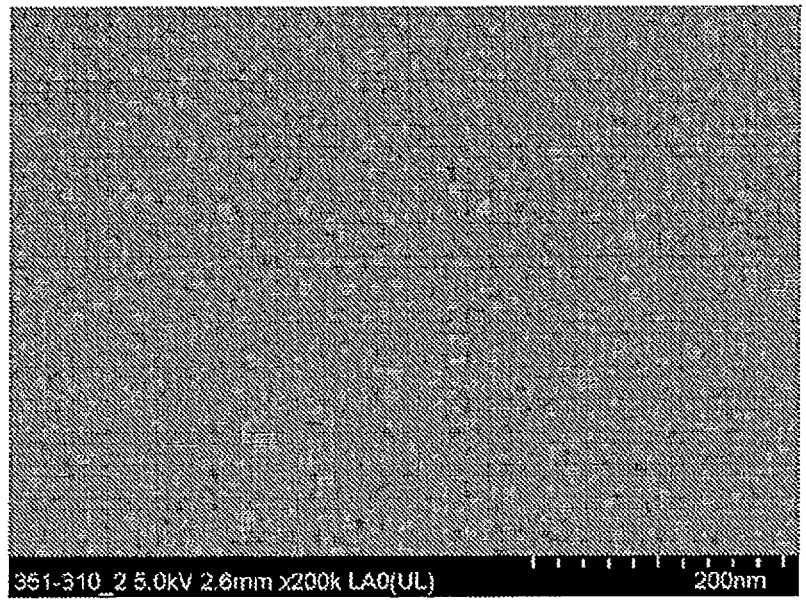
FIG. 29 is a scanning electron micrograph of a cobalt film deposited from the Co(tBuNCHCHNtBu)$_2$ precursor on a fluorine-free tungsten substrate, in which the film was deposited at temperature of 250° C., pressure of 10 torr, co-reactant hydrogen flow of 3 L per minute, yielding a cobalt film thickness of 39.8 Å, and film resistivity of 139 μΩ-cm.

FIG. 29 is a scanning electron micrograph of a cobalt film deposited from the Co(tBuNCHCHNtBu)$_2$ precursor on a fluorine-free tungsten substrate, in which the film was deposited at temperature of 250° C., pressure of 10 torr, co-reactant hydrogen flow of 3 L per minute, yielding a cobalt film thickness of 39.8 Å, and film resistivity of 139 µΩ-cm.

Figure 30:
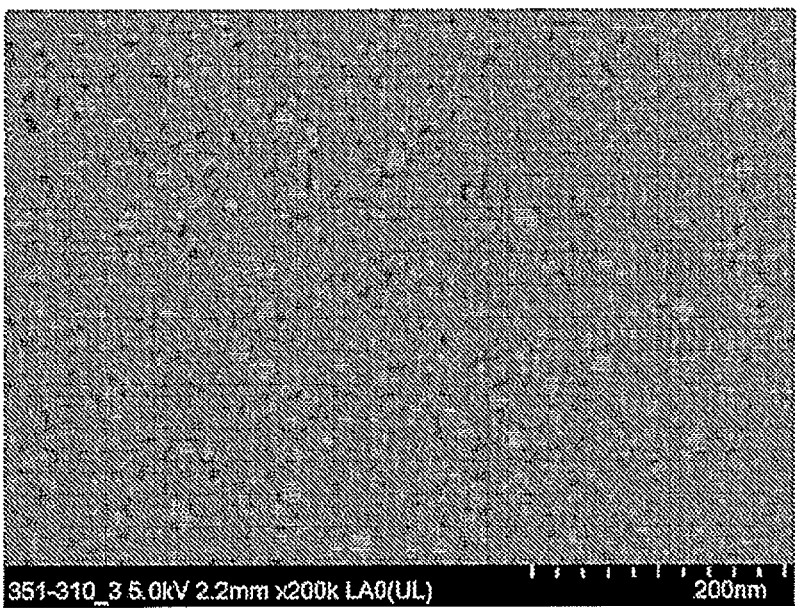
FIG. 30 is a scanning electron micrograph of a cobalt film deposited from the Co(tBuNCHCHNtBu)$_2$ precursor on a fluorine-free tungsten substrate, in which the film was deposited at temperature of 250° C., pressure of 30 torr, co-reactant hydrogen flow of 3 L per minute, yielding a cobalt film thickness of 35.8 Å, and a film resistivity of 169 μΩ-cm.

FIG. 30 is a scanning electron micrograph of a cobalt film deposited from the Co(tBuNCHCHNtBu)$_2$ precursor on a fluorine-free tungsten substrate, in which the film was deposited at temperature of 250° C., pressure of 30 torr, co-reactant hydrogen flow of 3 L per minute, yielding a cobalt film thickness of 35.8 Å, and a film resistivity of 169 µΩ-cm.

Figure 31:
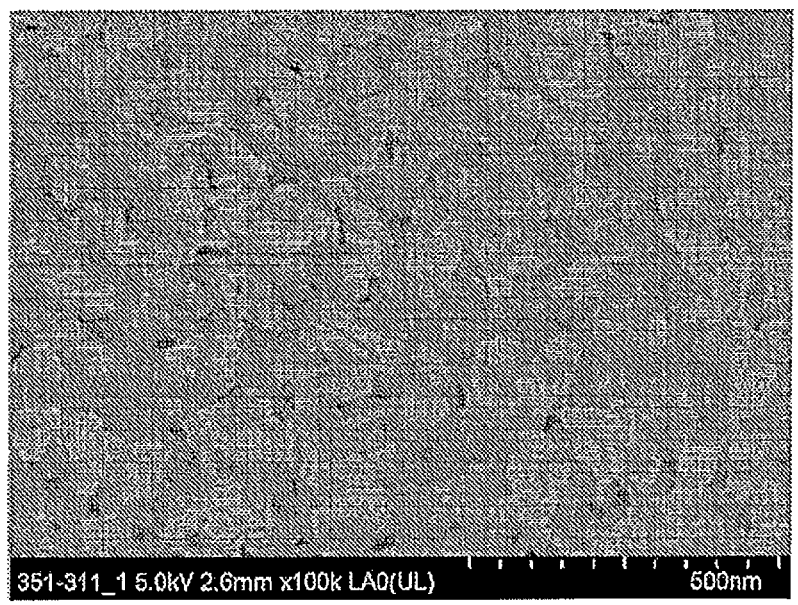
FIG. 31 is a micrograph of a cobalt film deposited from the Co(tBuNCHCHNtBu)$_2$ precursor on a copper substrate, at deposition temperature of 200° C., yielding a cobalt film thickness of 169.5 Å.

FIG. 31 is a micrograph of a cobalt film deposited from the Co(tBuNCHCHNtBu)$_2$ precursor on a copper substrate, at deposition temperature of 200° C., yielding a cobalt film thickness of 169.5 Å.

Figure 32:
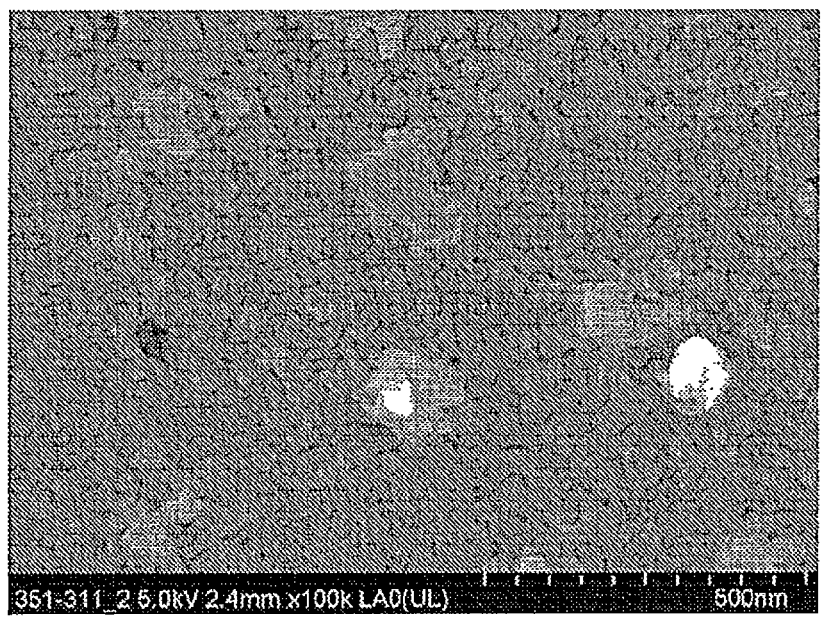
FIG. 32 is a micrograph of a cobalt film deposited from the Co(tBuNCHCHNtBu)$_2$ precursor on a copper substrate, at deposition temperature of 150° C., yielding a cobalt film thickness of 97.6 Å.

FIG. 32 is a micrograph of a cobalt film deposited from the Co(tBuNCHCHNtBu)$_2$ precursor on a copper substrate, at deposition temperature of 150° C., yielding a cobalt film thickness of 97.6 Å.

Samples of the cobalt film deposited from the Co(t-BuNCHCHNtBu)$_2$ precursor on fluorine-free tungsten substrates at deposition temperature of 250° C. were processed by 400° C. rapid thermal annealing in nitrogen (RTN), and the effect of such RTN processing on the sheet resistance and resistivity of the cobalt films was determined, with the results shown in Table 8 below.

TABLE 6

| Sample ID | XRF Thickness (A) | As dep Sheet R | AS dep R (μΩ · cm) | 400 C RTN Sheet R | 400 C RTN Resistivity (μΩ · cm) |
|---|---|---|---|---|---|
| 062514C-B | 39.8 | 348.7 | 138.8 | 215.4 | 85.7 |
| 062514C-CL | 48.5 | 200.9 | 97.4 | 110.9 | 53.8 |
| 062614A-B | 35.8 | 471.4 | 168.8 | 185.4 | 66.4 |
| 062614A-CL | 56.2 | 161.1 | 90.5 | 89.6 | 50.4 |

Figure 33:
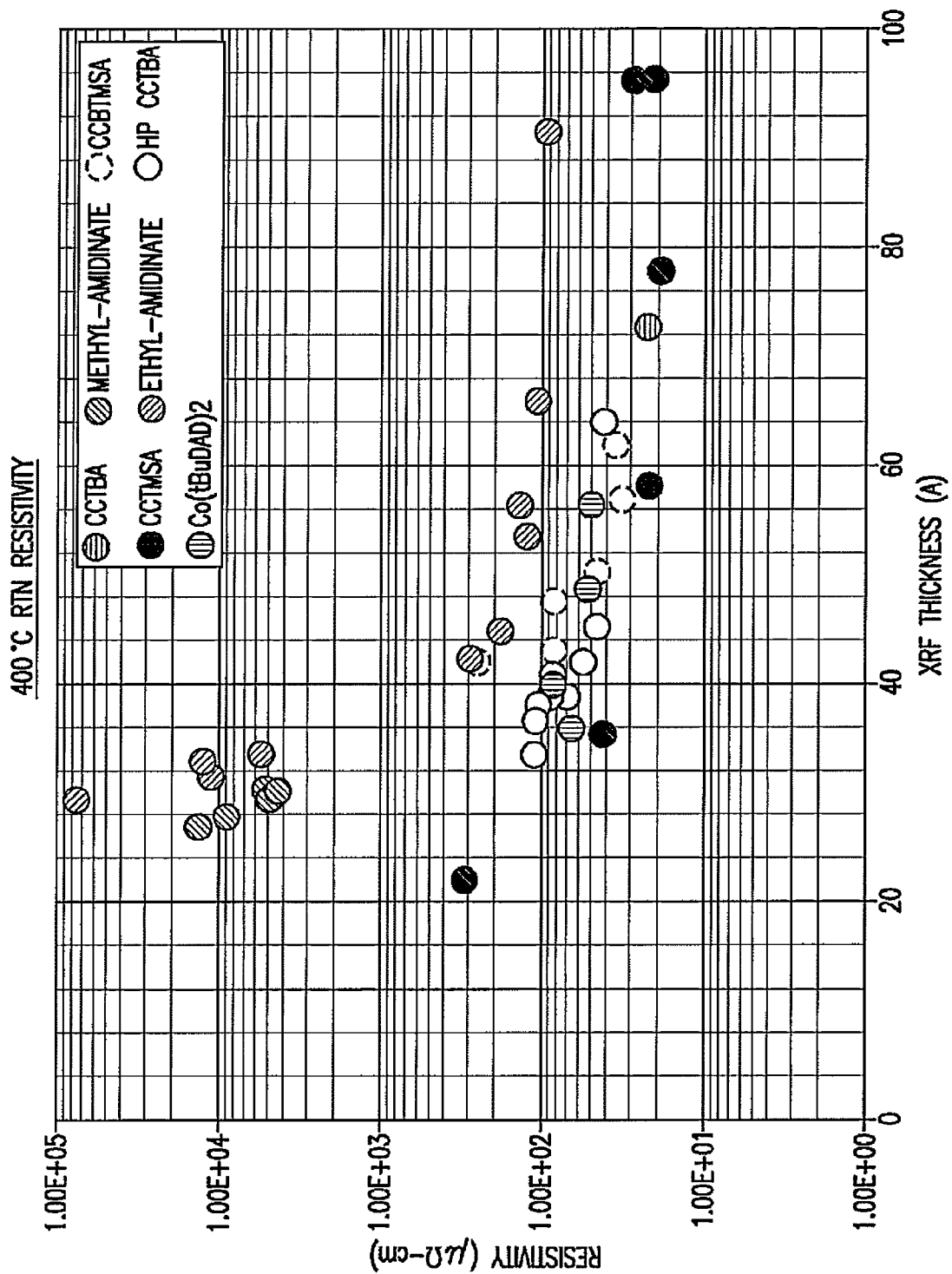
FIG. 33 is a graph of 400° C. RTN resistivity data for cobalt films deposited from the Co(tBuNCHCHNtBu)$_2$ precursor, and from other cobalt precursors, on fluorine-free substrates, as a function of XRF-determined film thickness. The additional cobalt precursors were: dicobalt hexacarbonyl tert-butylacetylene, which has the formula Co$_2$((CO)$_6$(HCC(CH$_3$)$_3$), with a boiling point of 52° C. at 0.8 torr (106.7 Pa), existing as a red liquid at 25° C. (CCTBA); high purity CCTBA (HP CCTBA); dicobalt hexacarbonyl trimethylsilyl acetylene (CCTMSA); cobalt carbonyl bis(trimethylsilyl acetylene, having the formula [((H$_3$C)Si)C≡C]$_2$Co(CO) (CCBTMSA); bis(N-methylacetamidinato)cobalt (Co(Methyl-Amidinate)); and bis(N-ethylacetamidinato)cobalt (Co(Ethyl-Amidinate)).

FIG. 33 is a graph of 400° C. RTN resistivity data for cobalt films deposited from the Co(tBuNCHCHNtBu)$_2$ precursor ("Co(tBuDAD)$_2$") on a fluorine-free tungsten substrate, and from other cobalt precursors on SiO$_2$ substrates, as a function of XRF-determined film thickness. The additional cobalt precursors were: dicobalt hexacarbonyl tert-butylacetylene, which has the formula Co$_2$(CO)$_6$(HCC(CH$_3$)$_3$), with a boiling point of 52° C. at 0.8 torr (106.7 Pa), existing as a red liquid at 25° C. (CCTBA); high purity CCTBA (HP CCTBA); dicobalt hexacarbonyl trimethylsilyl acetylene (CCTMSA); cobalt carbonyl bis(trimethylsilyl acetylene, having the formula [((H$_3$C)Si)C≡C]$_2$Co(CO) (CCBTMSA); bis(N-methylacetamidinato)cobalt (Co(Methyl-Amidinate)); and bis(N-ethylacetamidinato)cobalt (Co(Ethyl-Amidinate)).

The carbon content of cobalt films deposited from the Co(tBuNCHCHNtBu)$_2$ precursor at varying temperature was determined for a series of samples. The deposition temperature in various runs was 150° C., 200° C., and 250° C. The x-ray fluorescence (XRF) data are shown in Table 7 below, including the cobalt film thickness, in Ångströms, and the carbon content of the film, in micrograms per square centimeter (μg/cm$^2$). The ratio of carbon to cobalt in the film was determined, with the data shown in the table, in units of μg carbon/cm$^2$/100 Ångströms of the cobalt film.

TABLE 7

| Sample ID | Dep Temp (° C.) | XRF Co (A) | XRF C (μg/cm2) | C/Co (μg/cm2/100A) |
|---|---|---|---|---|
| 071814A-CL | 250 | 298.27 | 3.5911 | 1.204 |
| 071814A-CB | 250 | 277.5 | 3.3689 | 1.214 |
| 072514A-CL | 200 | 197.3 | 0.3495 | 0.177 |
| 072514B-CB | 200 | 238.98 | 0.3734 | 0.156 |
| 072514C-CB | 150 | 179.3 | 0.1546 | 0.086 |
| 082714C-CB | 150 | 149.5 | 0.0977 | 0.065 |
| 082814A-CB | 150 | 162 | 0.1504 | 0.093 |
| 090214A-CB | 150 | 96.14 | 0.0723 | 0.075 |

The data in Table 7 shows that the carbon content of the cobalt film was significantly reduced at deposition temperature of 150° C., in relation to carbon content at deposition temperatures of 200° C. and 250° C., with a greater than 15 times reduction in C/Co being shown for the deposition temperature of 150° C., relative to the higher deposition temperatures for which data were tabulated.

Figure 34:
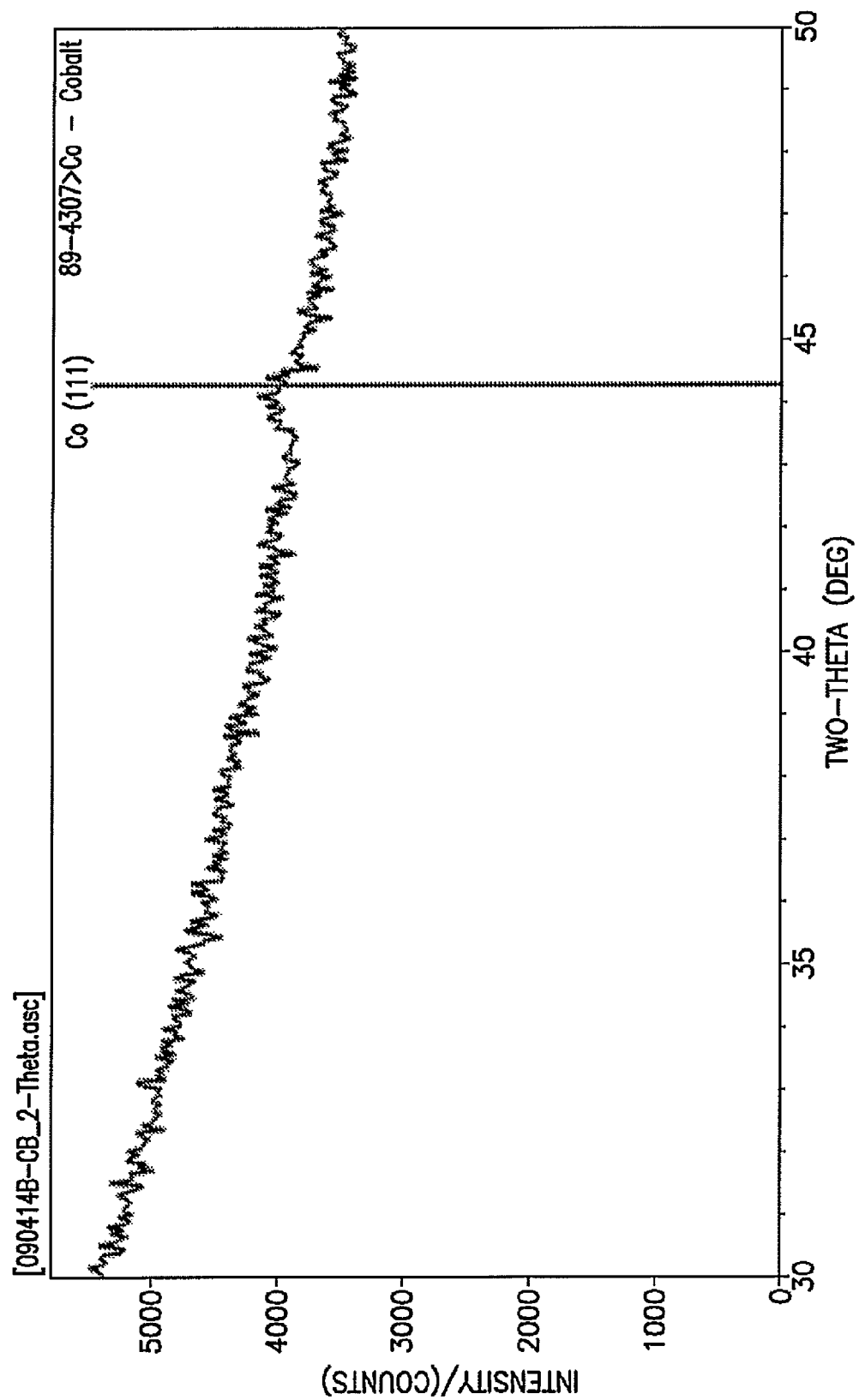
FIG. 34 is an XRD plot of a crystalline cobalt film deposited at 150° C. from the Co(tBuNCHCHNtBu)$_2$ precursor, in arbitrary intensity units, as a function of the two-theta angle, in degrees.

FIG. 34 is an XRD plot of a crystalline cobalt film deposited at 150° C. from the Co(tBuNCHCHNtBu)$_2$ precursor, in arbitrary intensity units, as a function of the two-theta angle, in degrees.

Figure 35:
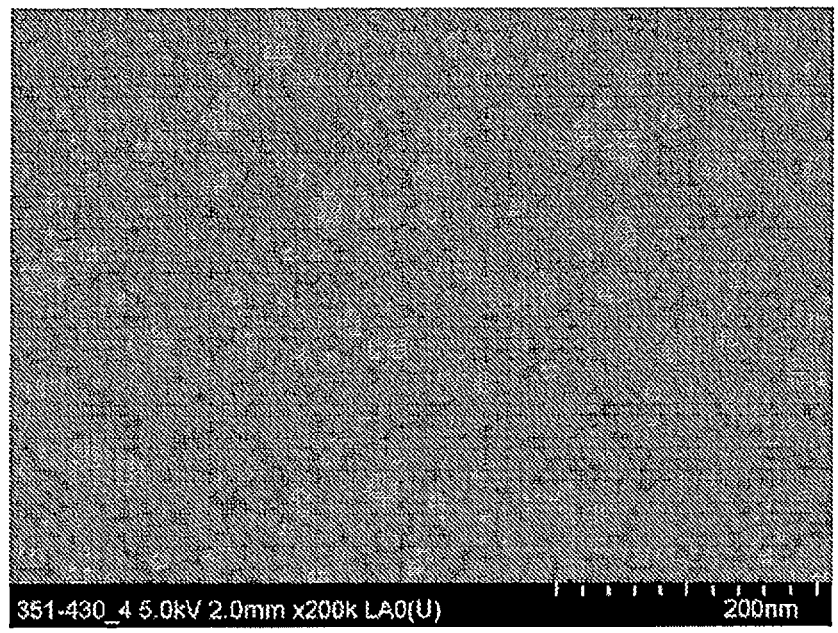
FIG. 35 is a scanning electron micrograph of a cobalt film having a thickness of 39.9 Å, which was deposited from the Co(tBuNCHCHNtBu)$_2$ precursor on a substrate at a deposition rate of 150 μmoles per minute, at a pressure of 30 torr and a co-reactant hydrogen flow rate of 3 L per minute.

FIG. 35 is a scanning electron micrograph of a cobalt film having a thickness of 39.9 Å, which was deposited from the Co(tBuNCHCHNtBu)$_2$ precursor on a substrate at a deposition rate of 150 μmoles per minute, at a pressure of 30 torr and a co-reactant hydrogen flow rate of 3 L per minute.

Figure 36:
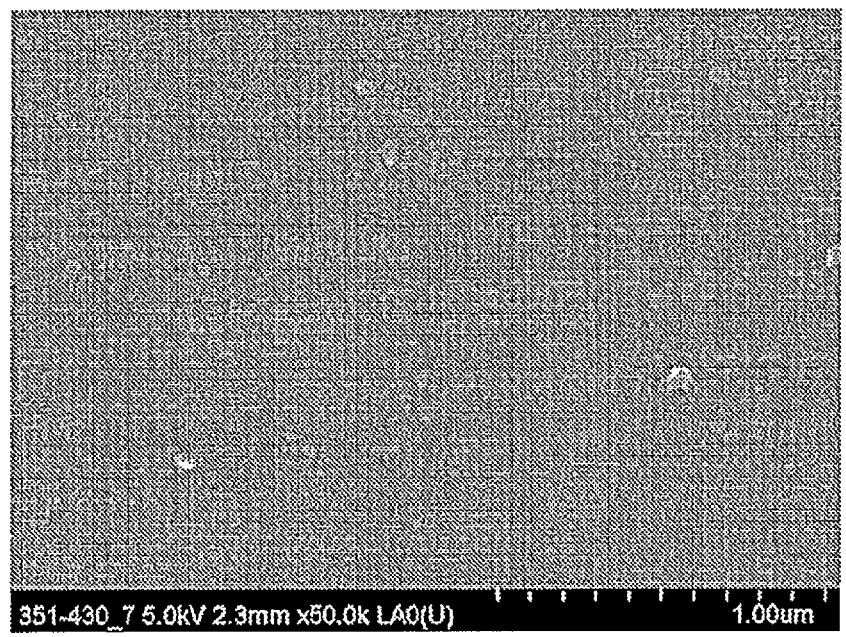
FIG. 36 is a scanning electron micrograph of a cobalt film having a thickness of 13.4 Å, which was deposited from the Co(tBuNCHCHNtBu)$_2$ precursor on a substrate at a deposition rate of 150 μmoles per minute, at a pressure of 10 torr and a co-reactant hydrogen flow rate of 3 L per minute.

FIG. 36 is a scanning electron micrograph of a cobalt film having a thickness of 13.4 Å, which was deposited from the Co(tBuNCHCHNtBu)$_2$ precursor on a substrate at a deposition rate of 150 μmoles per minute, at a pressure of 10 torr and a co-reactant hydrogen flow rate of 3 L per minute.

The selective deposition of cobalt on copper in narrow via and trench cavities of semiconductor substrates at relatively low temperatures with a low level of resultant defects in the cobalt has heretofore been quite challenging. In such selective deposition in a via or a trench, it is desirable to achieve homogeneous and complete filling with a smooth surface (suppression of grain formation), and without deposition on low k material and hard masks, particularly titanium nitride (TiN).

In such applications, it has surprisingly and unexpectedly been discovered that deposition of cobalt on copper can be achieved with remarkable diminution of defects that would otherwise be present in the deposited cobalt, by pre-deposition treatment of the copper substrate with a cleaning composition comprising base and oxidizing agent having pH in a range of from 5 to 10, and more preferably having pH in a range of greater than 7 up to 10.

In addition to significantly decreasing the formation of defects during cobalt deposition in the via or trench, such pre-deposition cleaning treatment can be used to pull back or even remove the TiN hard mask as well as removing fluorocarbon (CF$_x$) polymers.

While the ensuing disclosure is primarily directed to pre-deposition treatment of copper with the cleaning composition to enable subsequent deposition of cobalt with reduced cobalt defectivity in relation to corresponding deposition of cobalt without such pre-deposition cleaning treatment, it is to be appreciated that the utility of the pre-deposition treatment method and associated cleaning composition is not thus limited, but extends to pre-deposition cleaning of other metals than copper and subsequent deposition of other metals than cobalt. For example, the pre-deposition cleaning of tungsten for subsequent metallization deposition is contemplated, in another aspect of the disclosure.

The cleaning composition may be of any suitable type having the specified components and pH characteristic, which is effective to effect reduction of defects in the cobalt deposited on copper, in relation to the level of defects occurring in corresponding cobalt deposited on the copper in the absence of pre-deposition treatment with the cleaning composition.

Cleaning compositions of a type described in International Patent Application PCT/US2012/071777 filed Dec. 27, 2012, meeting the foregoing criteria, may be usefully employed in the broad practice of the present disclosure to provide reduced defect cobalt on copper. The disclosure of such International Patent Application PCT/US2012/071777 is hereby incorporated herein by reference in its entirety.

The pre-deposition cleaning of the copper on which cobalt is to be deposited may be carried out in any suitable manner to effect contacting of the copper with the cleaning composition for a period of time that is effective to achieve the diminution of defects in the deposited cobalt. Suitable contacting times may be empirically determined by varying the contact time of the cleaning composition with copper samples followed by deposition of cobalt, to determine appropriate contact times for achievement of deposited cobalt of a specific reduced defect character. In some embodiments, the cleaning composition may be contacted with the copper for a period of 0.25 to 30 minutes, at temperature in a range of from about 15° C. to about 100° C., although shorter or longer contact times and different temperature conditions may be necessary or desirable in other embodiments, depending on the character of the cleaning composition and the specific copper material that is being cleaned in the pre-deposition cleaning operation.

Contacting of the cleaning composition with the copper may be carried out in any suitable manner, and may in specific embodiments be affected by immersion contacting, spray application of cleaning composition, mist or aerosol application, or any other suitable contacting method.

The contacting of the copper with the cleaning composition may be followed with a rinse step in which the cleaned copper is rinsed with deionized water or other solvent, to remove any residue front the copper, to prepare it for the subsequent deposition of cobalt thereon. The cobalt deposition can then be carried out using a cobalt precursor of the present disclosure.

The base utilized in the cleaning composition may be of any suitable type, and may in specific embodiments be selected from among: ammonium hydroxide compounds of the formula $NR_1R_2R_3R_4OH$, wherein $R_1$, $R_2$, $R_3$, $R_4$ may be the same as or different from one another and each is independently selected from the group consisting of: hydrogen; straight-chained or branched $C_1$-$C_6$ alkyl groups (e.g., methyl, ethyl, propyl, butyl, pentyl, hexyl); $C_1$-$C_6$ alkoxy groups; $C_1$-$C_6$ hydroxyalkyl groups, (e.g., hydroxyethyl, hydroxypropyl); and substituted and unsubstituted aryl groups (e.g., benzyl); potassium hydroxide; tetrabutylphosphonium hydroxide (TBPH); 1,1,3,3-tetramethylguanidine (TMG); guanidine carbonate; arginine; monoethanolamine (MEA); diethanolamine (DEA); triethanolamine (TEA); ethylenediamine; cysteine; and combinations of the foregoing.

Specific base components of the foregoing types, as potentially useful in cleaning compositions of the present disclosure, include tetramethylammonium hydroxide (TMAH), tetraethylammonium hydroxide (TEAH), tetrapropylammonium hydroxide (TPAH), tetrabutylammonium hydroxide (TBAH), benzyltrimethylammonium hydroxide (BTMAH), benzyltriethylammonium hydroxide (BTEAH), (2-hydroxyethyl) trimethyiammonium hydroxide, (2-hydroxyethyl) triethylammonium hydroxide, (2-hydroxyethyl) tripropylammonium hydroxide, (1-hydroxypropyl) trimethylammonium hydroxide, ethyltrimethylammonium hydroxide, diethyldimethylammonium hydroxide (DEDMAH), and combinations of two or more thereof.

The oxidizing agent employed in the cleaning composition may be of any suitable type, and may in specific embodiments be selected from among: hydrogen peroxide: $FeCl_3$; $FeF_3$; $Fe(NO_3)_3$; $Sr(NO_3)_2$; $CoF_3$; $MnF_3$; oxone ($2KHSO_5.KHSO_4.K_2SO_4$); periodic acid: iodic acid; vanadium (V) oxide; vanadium (IV,V) oxide; ammonium vanadate; ammonium peroxomonosulfate: ammonium chlorite ($NH_4ClO_2$); ammonium chlorate ($NH_4ClO_3$); ammonium iodate ($NH_4IO_3$); ammonium nitrate ($NH_4IO_3$); ammonium perborate ($NH_4BO_3$); ammonium perchlorate ($NH_4ClO_4$); ammonium periodate ($NH_4IO_3$); ammonium persulfate (($NH_4)_2S_2O_8$); ammonium hypochlorite ($NH_4ClO_4$); ammonium tungstate (($NH_4)_{10}H_2(W_2O_7)$); sodium persulfate ($Na_2S_2O_8$); sodium hypochlorite (NaClO); sodium perborate; potassium iodate ($KIO_3$); potassium permanganate ($KMnO_4$); potassium persulfate; nitric acid ($HNO_3$); potassium persulfate ($K_2S_2O_8$); potassium hypochlorite (KClO); tetramethylammonium chlorite (($N(CH_3)_4)ClO_2$): tetramethylammonium chlorate (($N(CH_3)_4)ClO_3$); tetramethylammonium iodate (($N(CH_3)_4)IO_3$); tetramethylammonium perborate (($N(CH_3)_4)BO_3$): tetramethylammonium perchlorate (($N(CH_3)_4)ClO_4$); tetramethylammonium periodate ((N$CH_3)_4)IO_4$); tetramethylammonium persulfate (($N(CH_3)_4)S_2O_8$); tetaabutylammonium peroxomonosulfate; peroxomonosulfuric acid; ferric nitrate ($Fe(NO_3)_3$); urea hydrogen peroxide (($CO(NH_2)_2)H_2O_2$); peracetic acid ($CH_3(CO)OOH$); 1,4-benzoquinone; toluquinone; dimethyl-1,4-benzoquinone; chloranil; alloxan; N-methylmorpholine N-oxide; trimethylamine N-oxide: and combinations of two or more of the foregoing.

The cleaning composition may in specific embodiments further comprise one or more metal corrosion inhibitor components, e.g., metal corrosion inhibitor selected from the group consisting of 5-amino-1,3,4-thiadiazole-2-thiol (ATDT), benzotriazole (BTA), 1,2,4-triazole (TAZ), tolytriazole, 5-methyl-benzotriazole, 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-aminotetrazole, pentylenetetrazole, 5-phenyl-1H-tetrazole, 5-benzyl-1H-tetrazole, Ablumine O, 2-benzylpyridine, succinimide, 2,4-diamino-6-methyl-1,3,5-triazine, thiazole, triazine, methyltetrazole, 1,3-dimethyl-2-imidazolidmone, 1,5-pentamethylenetetrazole, 1-phenyl-5-mercaptotetrazole, diaminomethyltriazine, imidazoline thione, 4-methyl-4H-1,2,4-mazole-3-thiol, benzothiazole, imidazole, indiazole, adenosine, carbazole, saccharin, benzoin oxime, PolyFox PF-159, poly(ethylene glycol), poly(propylene glycol), PEG-PPG copolymers, dodecylbenzenesulfonic acid, benzalkonium chloride, benzyldimethyidodecylammonium chloride, myristyltrimethylammonium bromide, dodecyltrimethylammonium bromide, hexadecylpyridinium chloride, Aliquat 336, benzyldimethylphenylammonium chloride, Crodaquat TES, Rewoquat CPEM, hexadecyltrimethylammonium p-toluenesulfonate, hexadecyltrimethylammonium hydroxide, 1-methyl-1'-tetradecyl-4,4'-bipyridium dichloride, alkyltrimethylammonium bromide, amprolium hydrochloride, benzethonium hydroxide, benzethonium chloride, benzyldimethylhexadceylammonium chloride, benzyldimethyltetradceylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldimcthylammonium bromide, dodecyltrimethylammonium chloride, ethylhexadecyldimethyiammonium bromide, Girard's reagent, hexadecyl(2-hydroxyethyl)dimethylammonium dihydrogen phosphate, dexadecylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis(decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate, 1-decyl-3-methylimidazolium chloride, tridodecylmethylammonium bromide, dimethyldistearylammonium chloride, hexamethonium chloride, and combinations of two or more of the foregoing.

In particular embodiments, the cleaning composition may additionally comprise oxidizing agent stabilizer, as for example stabilizer selected from among glycine, serine, proline, leucine, alanine, asparagine, aspartic acid, glutamine, valine, and lysine, oitrilotriacetic acid, iminodiacetic acid, etidronic acid, ethylenediaminetetraacetic acid (EDTA), (1,2-cyclohexylenedinitrilo)tetraacctic acid (CDTA), uric acid, tetraglyme, diethylenctriamine pentaacetic acid, propylenediamine tetraacetic acid, ethylendiamine disuccinic acid, sulfanilamide, and combinations of two or more of the foregoing.

The cleaning composition can be formulated to comprise any of various suitable solvents, as for example, water, water-miscible organic solvents, and combinations of the foregoing. Water-miscible organic solvents that may be usefully employed in specific cleaning compositions include those of the formula $R^1R^2R^3C(OH)$, where $R^1$, $R^2$ and $R^3$ are independent from each other and are selected from to the group consisting of hydrogen, $C_2$-$C_{30}$alkyls, $C_2$-$C_{30}$alkenes, cycloalkyls, $C_2$-$C_{30}$alkoxys, and combinations thereof.

Specific solvents that may be usefully employed in specific embodiments include those selected from the group consisting of water, methanol, ethanol, isopropanol, butanol, pentanol, hexanol, 2-ethyl-1-hexanol, heptanol, octanol, ethylene glycol, propylene glycol, butylene glycol, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, methyl perfluorobutylether, methyl perfluorobutylether, alkyl carbonates, alkylene carbonates, 4-methyl-2-pentanol, and combinations of two or more of the foregoing.

In specific embodiments, the solvent may comprise water, such as deionized water.

In cleaning compositions in which water is employed as a solvent, the amount of water in the composition may be of a suitable amount that is effective to enable the composition to achieve its intended purpose of reducing defects in the cobalt deposited on the copper that is cleaned with such composition. The cleaning composition may for example comprise water in an amount of from 65 wt % to 95 wt % or more, based on the total weight of the cleaning composition.

In specific embodiments, the cleaning composition may comprise an aqueous composition including from 0.1 wt % to 10 wt % base, and from 5 wt % to 40 wt % oxidizing agent, based on total weight of the cleaning composition.

In various embodiments, the cleaning composition may be provided in the form of a cleaning composition concentrate that then is diluted or otherwise mixed with solvent and/or other components to constitute the final cleaning composition for use. In this respect, the oxidizing agent may be absent from the concentrate, to avoid issues of instability of the oxidizing agent when the concentrate is stored for a significant period of time, and the concentrate may be mixed with the oxidizing agent at the point of use, e.g., in a semiconductor manufacturing facility.

In specific implementations, the cleaning composition may comprise any other suitable components, such as surfactants, dielectric passivating agents, stabilizers, dispersing or suspending agents, etc.

The cleaning composition and pre-deposition cleaning method of the present disclosure are highly effective in achieving substantial reduction of defects in deposited metal that is deposited on other metals in semiconductor substrate cavities such as vias and trenches. This is shown in FIGS. 37 and 38.

Figure 37:
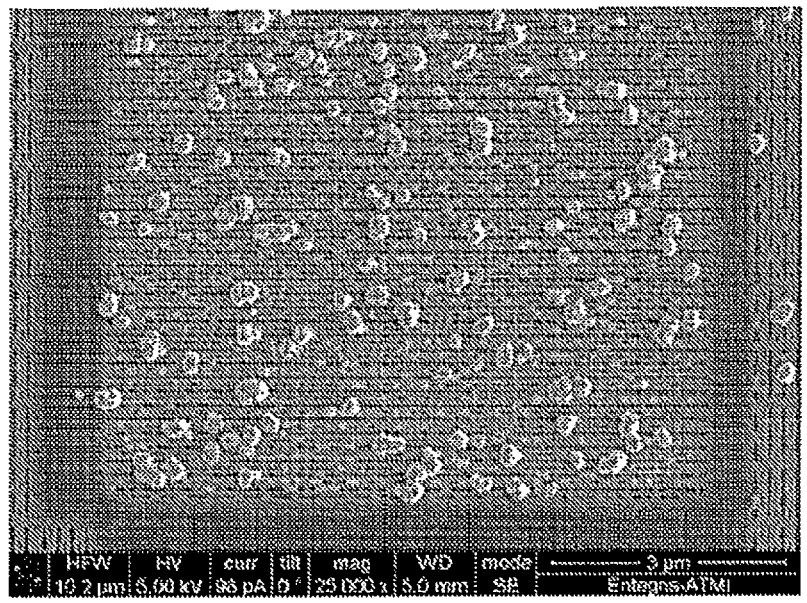
FIG. 37 is an electron micrograph at a magnification of 25,000 times, showing a cobalt film that has been deposited on copper that has not been cleaned by a pre-deposition cleaning with the cleaning composition of the present disclosure.

FIG. 37 is an electron micrograph at a magnification of 25,000 times, showing a cobalt film that has been deposited on copper that has not been cleaned by a pre-deposition cleaning with the cleaning composition of the present disclosure. The resulting cobalt film exhibits many defects, as is readily visually apparent from such micrograph.

Figure 38:
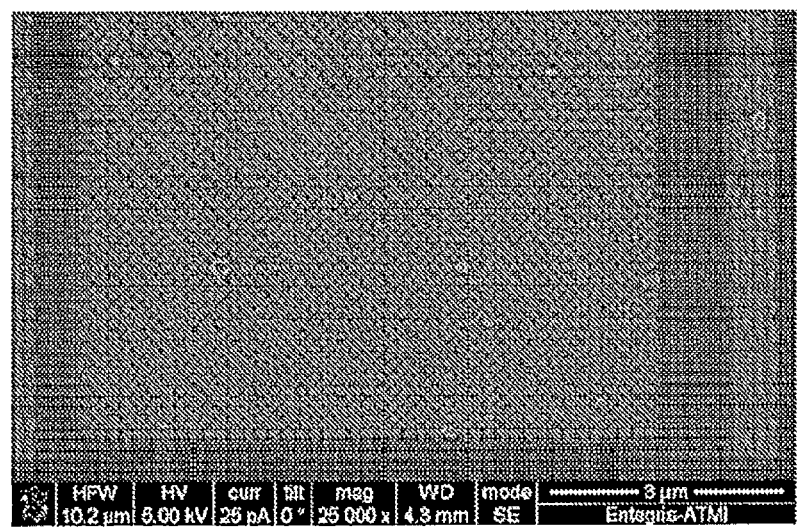
FIG. 38 is an electron micrograph at a magnification of 25,000 times, showing a cobalt film that has been deposited on copper that has been cleaned with a cleaning composition of the present disclosure, comprising an approximate weight percentage composition of 89% deionized water, 9% oxidizing agent, and 2% base, based on total weight of the cleaning composition, as contacted with the copper for 2 minutes at 50° C.

FIG. 38 is an electron micrograph at a magnification of 25,000 times, showing a cobalt film that has been deposited on copper that has been cleaned with a cleaning composition of the present disclosure, comprising an approximate weight percentage composition of 89% deionized water, 9% oxidizing agent, and 2% base, based on total weight of the cleaning composition, as contacted with the copper for 2 minutes at 50° C. The resulting cobalt film deposited on such cleaned copper, as shown in FIG. 38, exhibits few visual defects (<1%).

A comparison of FIGS. 37 and 38 shows the striking reduction in cobalt film defects that has been achieved by the cleaning method and composition of the present disclosure.

In another aspect, the disclosure relates to a method of reducing defects in a deposited metal that is vapor deposited on a base metal, such method comprising cleaning the base metal, prior to vapor deposition of the deposited metal thereon, with a cleaning composition comprising etchant, oxidizing agent, and optionally corrosion inhibitor, having pH in a range of from 0 to 4. Such method may be conducted with a base metal such as tungsten, or other suitable metal. The composition may be substantially devoid of hydrogen peroxide, and may be variously constituted with suitable etchant species.

In various embodiments, the etchant may comprise a species selected from the group consisting of $H_2ZrF_6$, $H_2TiF_6$, $HPF_6$, HF, ammonium fluoride, tetrafluoroboric acid, hexafluorosilicic acid, tetrabutylammonium tetrafluoroborate (TBA-$BF_4$), ammonium hexafluorosilicate, ammonium hexafluorotitanate, tetraalkylaminonium fluoride ($NR_1R_2R_3R_4F$), tetraalkylammonium hydroxide ($NR_1R_2R_3R_4OH$), where $R_1$, $R_2$, $R_3$, $R_4$ may be the same as or different from one another and each is independently selected from the group consisting of straight-chained or branched $C_1$-$C_6$ alkyl groups, weak bases, and combinations thereof.

In other embodiments, the etchant may comprise tetrafluoroboric acid or hexafluorosilicic acid.

In the preceding method involving a cleaning composition having pH in a range of from 0 to 4, the oxidizing agent may be of any suitable type and may for example comprise a species selected from the group consisting of $FeCl_3$ (both hydrated and unhydrated), $Fe(NO_3)_3$, $Sr(NO_3)_2$, $CoF_3$, $FeF_3$, $MnF_3$, oxone ($2KHSO_5.KHSO_4.K_2SO_4$), periodic acid, iodic acid, vanadium (V) oxide, vanadium (IV,V) oxide, ammonium vanadate, ammonium peroxomonosulfate, ammonium chlorite ($NH_4ClO_2$), ammonium chlorate ($NH_4ClO_3$), ammonium iodate ($NH_4IO_3$), ammonium nitrate ($NH_4NO_3$) ammonium perborate ($NH_4BO_3$), ammonium perchlorate ($NH_4ClO_4$), ammonium periodate ($NH_4IO_3$), ammonium persulfate (($NH_4)_2S_2O_8$), ammonium hypochlorite ($NH_4ClO$), ammonium tungstate (($NH_4)_{10}H_2(W_2O_7)$), sodium persulfate ($Na_2S_2O_8$), sodium hypochlorite ($NaClO$), sodium perborate, potassium iodate ($KIO_3$), potassium permanganate ($KMnO_4$), potassium persulfate, nitric acid ($HNO_3$), potassium persulfate ($K_2S_2O_8$), potassium hypochlorite ($KClO$), tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$), tetrabutylammonium peroxomonosulfate, peroxomonosulfuric acid, ferric nitrate ($Fe(NO_3)_3$), peracetic acid ($CH_3(CO)OOH$), 1,4-benzoquinone, toluquinone, dimethyl-1,4-benzoquinone, chloranil, alloxan, N-methylmorphine N-oxide, trimethylamine N-oxide, and combinations thereof.

In other embodiments of the method involving a cleaning composition having pH in a range of from 0 to 4, the oxidizing agent may comprise a species selected from the group consisting of vanadium oxide, ammonium iodate, ammonium periodate, ammonium vanadate, periodic acid, iodic acid, and 1,4-benzoquinone. In still other embodiments, the oxidizing agent in the cleaning composition may comprise a species selected from the group consisting of ammonium iodate, ammonium periodate, iodic acid, and periodic acid.

The cleaning composition having pH in a range of from 0 to 4 may be constituted as comprising at least one iodine scavenger, such as an iodine scavenger comprising a ketone.

In other embodiments, the iodine scavenger may be selected from the group consisting of 4-methyl-2-pentanone, 2,4-dimethyl-3-pentanone, cyclohexanone, 5-methyl-3-heptanone, 3-pentanone, 5-hydroxy-2-pentanone, 2,5-hexanedione, 4-hydroxy-4-methyl-2-pentanone, acetone, butanone, 2-methyl-2-butanone, 3,3-dimethyl-2-butanont 4-hydroxy-2-butanone, cyclopentanone, 2-pentanone, 3-pentanone, 1-phenylethanone, acetophenone, benzophenone, 2-hexatone, 3-hexatone, 2-heptanone, 3-heptanone, 4-heptanone, 2,6-dimethyl-4-heptanone, 2-octanone, 3-octanone, 4-octanone, dicyclohexyl ketone, 2,6-dimethylcyclohexanone, 2-acetylcyclohexanone, 2,4-pentanedione, menthone, and combinations thereof.

In still other embodiments, the iodine scavenger may be selected from the group consisting of 4-methyl-2-pentanone, 2,4-dimethyl-3-pentanone, and cyclohexanone.

The cleaning composition having pH in a range of from 0 to 4 may further comprise a solvent, such as water, e.g., to constitute a composition comprising at least 98 wt % water, based on total weight of the composition.

The cleaning composition having pH in a range of from 0 to 4 may comprise a suitable corrosion inhibitor, such as a corrosion inhibitor comprising a species selected from the group consisting of 5-amino-1,3,4-thiadiazole-2-thiol (ATDT), benzotriazole (BTA), 1,2,4-triazole (TAZ), tolyltriazole, 5-methyl-benzotriazole, 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-aminotetrazole, pentylenetetrazole, 5-phenyl-1H-tetrazole, 5-benzyl-1H-tetrazole, Ablumine O, 2-benzylpyridine, succinimide, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, benzothiazole, imidazole, indiazole, adenosine, carbazole, saccharin, benzoin oxime, PolyFox PF-159, poly(ethylene glycol), poly (propylene glycol), PEG-PPG copolymers, dodecylbenzenesulfonic acid, sodium dodecylbenzenesulfonate, and combinations thereof.

In other embodiments, the corrosion inhibitor may comprise a cationic quaternary species selected from the group consisting of cationic quaternary salts such as benzalkonium chloride, benzyldimethyldodecylammonium chloride, myristyltrimethylammonium bromide, dodecyltrimethylammonium bromide, hexadecylpyridinium chloride, Aliquat 336, benzyldimethylphenylammonium chloride, Crodaquat TES, Rewoquat CPEM, hexadecyltrimethylammonium p-toluenesulfonate, hexadecyltrimethyiammonium hydroxide, 1-methyl-1'-tetradecyl-4,4'-bipyridium dichloride, alkyltrimethylammonium bromide, amprolium hydrochloride, benzethonium hydroxide, benzethonium chloride, benzyldimethylhexadecylammonium chloride, benzyldimethyltetradecylammonium chloride, benzyldodecyldimethylammonium bromide, benzyldodecyldimedrylammonium chloride, cetylpyridinium chloride, choline p-toluenesulfonate salt, dimethyldioctadecylammonium bromide, dodecylethyldimethylammonium bromide, dodecyltrimethylammonium chloride, ethylhexadecyldimethylammonium bromide, Girard's reagent, hexadecyl(2-hydroxyethyl)dimethylammonium dihydrogen phosphate, dexadceylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis(decyl)ammonium bromide, thonzonium bromide, tridodecylammonium chloride, trimethyloctadecylammonium bromide, 1-methyl-3-n-octylimidazolium tetrafluoroborate, 1-decyl-3-methoylimidazolium tetrafluoroborate, 1-decyl-3-methylimidazoliutn chloride, tridodecylmethylammonium bromide, dimethyldistearylammonium chloride, and hexamethonium chloride.

The cleaning composition having pH in a range of from 0 to 4 may also be constituted as comprising at least one additional component selected from the group consisting of surfactants, low-k passivating agents, silicon-containing compounds, and combinations thereof. The passivating agent may comprise a passivating agent selected from the group consisting of boric acid, ammonium pentaborate, sodium tetraborate, 3-hydroxy-2-naphthoic acid, malonic acid, iminodiacetic acid, and combinations thereof. The silicon-containing compound(s) may be selected from the group consisting of methyltrimethoxysilane, dimethyldimethoxysilane, phenyltrimethoxysilane, tetracthoxysilane (TEOS), N-propyltrimethoxysilane, N-propyltriethoxysilane, hexyltrimethoxysilane, hexyltriethoxysilane, ammonium hexaflurorosilicate, sodium silicate, tetramethyl ammonium silicate (TMAS), and combinations thereof.

The cleaning composition having pH in a range of from 0 to 4 may in various embodiments be substantially devoid of amines, abrasive materials, chloride sources, metal halides, and combinations thereof.

The disclosure in a further aspect relates to a method of reducing defects in a deposited cobalt that is vapor deposited on a base metal, wherein the cobalt is deposited by a process of the present disclosure, such method comprising cleaning the base metal, prior to vapor deposition of the deposited cobalt thereon, wherein the cleaning comprises (i) contacting the base metal with a cleaning composition comprising base and oxidizing agent, having pH in a range of from 5 to 10; (ii) contacting the base metal with a cleaning composition comprising etchant, oxidizing agent, and optionally corrosion inhibitor, having pH in a range of from 0 to 4; (iii) treating the base metal with hydrogen plasma; or (iv) treating the base mewl with hydrogen fluoride.

In another aspect, the disclosure relates to a method of forming deposited cobalt on a substrate, wherein prior to vapor deposition of cobalt on the substrate, the substrate is cleaned with a cleaning composition selected from among (i) cleaning compositions comprising base and oxidizing agent, having pH in a range of from 5 to 10, and (ii) cleaning compositions comprising etchant, oxidizing agent, and optionally corrosion inhibitor, having pH in a range of from 0 to 4, wherein the cleaning of the substrate is effective for at least one of (a) reducing defectively of the deposited cobalt, (b) removing $CF_X$ components from the substrate, and (c) removing or pulling back TiN present on the substrate. Such method may be carried out for highly effective deposition of cobalt on substrates such as copper substrates and tungsten substrates.

Another aspect of the disclosure relates to selective growth of cobalt on copper and selective growth of cobalt on barrier and liner materials that are in turn deposited on copper, in the achievement of void-free via fills. As discussed in the background section hereof, semiconductor manufacturing technology faces challenges in reducing interconnect line resistance and achieving high-yield void-free fill in vias in which copper is present and Ta, TaN, Ru, and Ru alloys may be employed, in copper-diffusion barriers and liners in the via.

The present disclosure contemplates cobalt deposition to achieve void-free via fills in small size vias, e.g. in dual-damascene structures and processes, in various embodiments, the void free via fills of the present disclosure may be carried out in vias having critical dimensions of from 15 nm to 45 nm, with aspect ratios of from 1:1 to 5:1, e.g., in a range of from 1.5:1 to 4.5:1, or a range of from 2:1 to 4:1, or an aspect ratio of 3:1.

In such via fills, cobalt may be vapor deposited in the via directly on copper therein, or on material that in turn is deposited on copper, e.g., a barrier or liner material comprising any one or more of tantalum, tantalum nitride, ruthenium, and ruthenium alloys. For example, the cobalt may be deposited, by CVD or other vapor deposition process, in the via on any of the following combinations of layers (where copper is the bottom layer in such layer sequence, and cobalt is deposited on the last material layer in the sequence): Cu/Ta/TaN: Cu/Ru/Ta/TaN; and Cu/Ru.

The disclosure further contemplates vapor deposition of cobalt on another layer of cobalt, in successive separate vapor deposition operations, in various embodiments of the disclosure.

The disclosure thus also contemplates implementations in which the deposited cobalt forms an interconnect line or a core of an interconnect line in the via, so that the cobalt forms the core of the via, and docs not serve only as a cap, barrier, or liner.

The deposition of cobalt for selective growth on copper to achieve void-free via fills is achieved in accordance with the present disclosure, using cobalt precursors such as those described herein, in vapor deposition processes, e.g., chemical vapor deposition (CVD).

A cobalt process can be conducted in which cobalt only selectively nucleates and grows on a copper surface at the bottom of a via to form a bottom-up fill of the via. This approach can be used in chemical vapor deposition processes, or other vapor deposition processes, for selective growth of cobalt to fill vias of very challenging dimensions. The via fill with cobalt can be followed by another interconnect metal fill of the lines in a dual-damascene structure.

Figure 39:
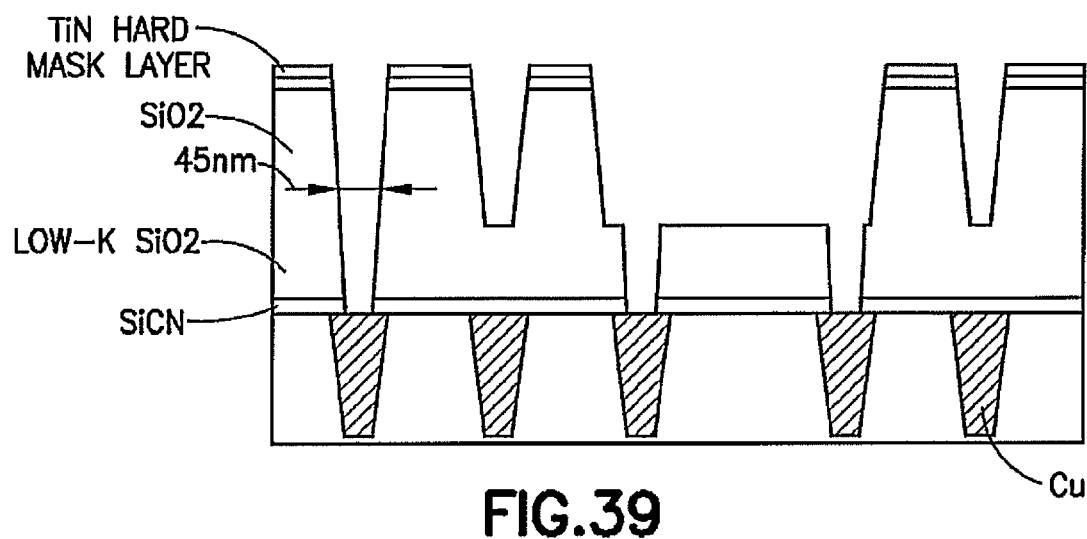
FIG. 39 is a schematic representation of a dual Damascene test structure utilized for cobalt deposition in accordance with the present disclosure, in a specific embodiment thereof.

By way of example, cobalt deposition was carried out using a dual damascene test structure as shown in FIG. 39, in which vias are filled with copper in a lower portion of the structure, and copper in some of such vias is exposed to upper section vias in a layer of $SiO_2$ on which a titanium nitride (TiN) hard mask layer has been formed. The vias had a diameter of 45 nm and a 3:1 aspect ratio.

Figure 40:
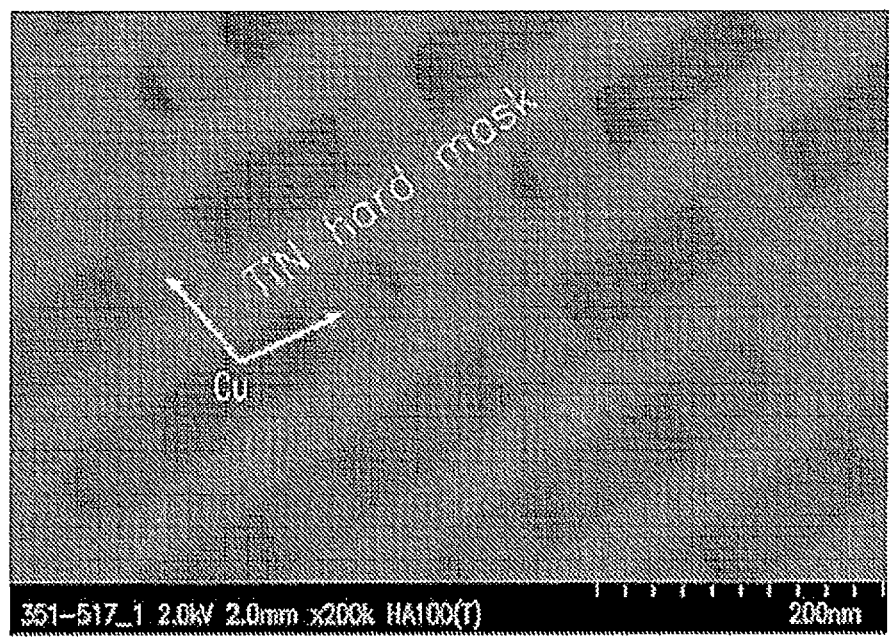
FIG. 40 is a top view micrograph of a via test structure prior to cobalt selective growth and fill.
Figure 41:
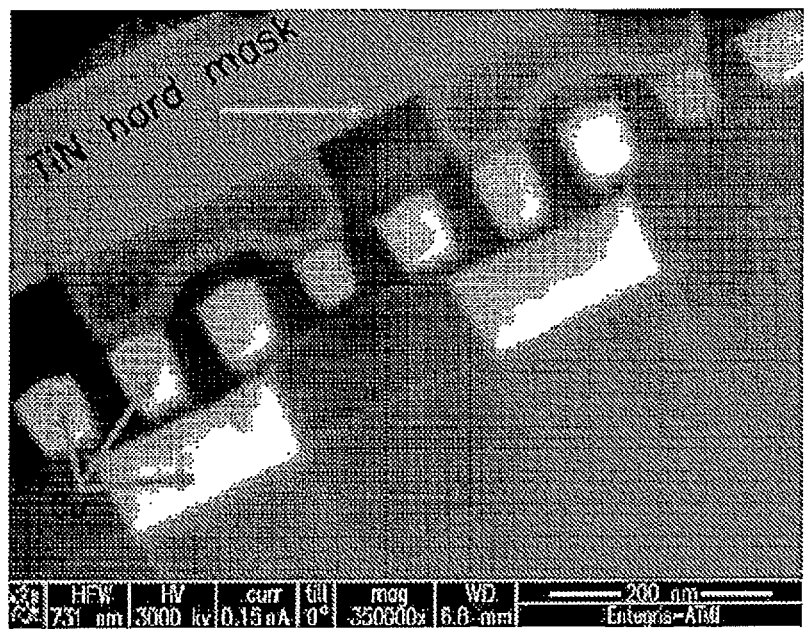
FIG. 41 is a cross-sectional view of the via test structure of FIG. 40.

FIG. 40 is a top view micrograph of the via test structure, and FIG. 41 is a cross-sectional view of the test structure, prior to cobalt selective growth and fill.

Cobalt depositions were performed on the test structures, both with and without removal of the TiN hard mask prior to cobalt deposition. In both cases, cobalt deposition was performed at temperature of approximately 200° C. in a 300 mm wafer CVD deposition system.

Figure 42:
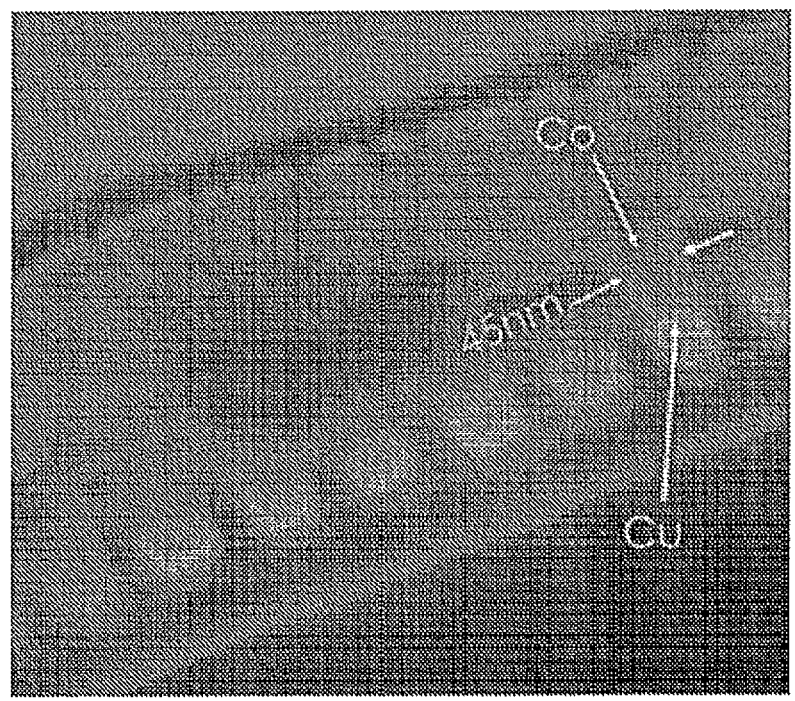
FIG. 42 is a scanning electron micrograph (SEM) of the cross-section of the cobalt filled via test structure, in which cobalt completely fills the ~135 nm tall and 45 nm diameter (3:1 aspect ratio) via structure.
Figure 43:
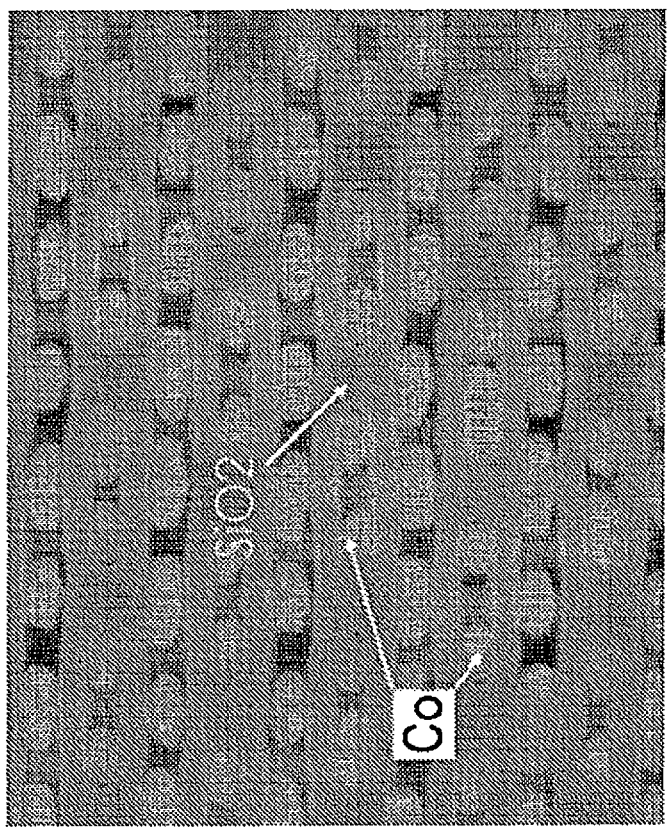
FIG. 43 is an SEM top view of the cobalt filled via test structure whose cross-sectional view is shown in FIG. 42.

FIG. 42 is a scanning electron micrograph (SEM) of the cross-section of the cobalt filled via structure, in which cobalt completely fills the ~135 nm tall and 45 nm diameter (3:1 aspect ratio) via structure. FIG. 43 is an SEM top view of the cobalt filled via, in which the cobalt deposition was carried out after the TiN hard mask w as removed. There was no deposition of cobalt in the area w here no copper presented (i.e., the area of the $SiO_2$ dielectric), and cobalt deposition only nucleated inside the via where the bottom was the exposed copper surface. This cobalt via fill thus provided highly selective growth of cobalt on the copper in the via, to effect the via fill.

Comparative deposition of cobalt on wafers in which the TiN hard mask was retained exhibited a significantly higher level defects than when such mask was removed, and the defect areas included various sizes of voids, in contrast to the cobalt fill that was carried out when the TiN hard mask had been removed prior to cobalt deposition. Such results indicate the advantage of removing the TiN hard mask prior to cobalt selective deposition being conducted.

When cobalt is grown inside a via, the growth is confined by the via and nucleation occurs on the growing surface. When growth of the cobalt passes the top of the via and there is excess growth lime, cobalt may nucleate on the sides of the cobalt external to the via and in consequence growth may occur in a lateral direction as well as an upward direction and form exterior "cauliflower"-like overgrowths. Such overgrowths may be acceptable within the overall structure of the device, or the overgrowth or portions thereof may be removed by appropriate etch or planarization techniques.

Scanning transmission electron microscope (STEM) images show that cobalt deposited in vias by the above-described fill process is nano-crystalline or nearly amorphous in nature, when growth temperatures on the order of 200° C. were employed. The grain size of the deposited cobalt in such fill process was estimated to be less than 10 nm, reflecting compatibility of the bottom-up fill of cobalt in vias beyond the 14 nm node.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in tire field of the present disclosure, based on the description herein. Correspondingly, the disclosure as hereinafter claimed is intended to be broadly construed and interpreted, as including ail such variations, modifications and alternative embodiments, within its spirit and scope.

What is claimed is:

1. A surface-selective deposition process for depositing cobalt on a having a copper surface, comprising:
cleaning the copper surface with an acid solution prior to vapor deposition of the deposited cobalt on the substrate, the acid solution having pH in a range of from 0 to 4;
cleaning the copper surface with a cleaning solution prior to vapor deposition of the deposited cobalt on the substrate, the cleaning solution comprising base and an oxidizing agent and having a pH in a range of from 5 to 10;
volatilizing a non-oxygen-containing cobalt precursor to form a precursor vapor, wherein the non-oxygen-containing cobalt precursor comprises a cobalt bis-diazadiene compound whose diazadiene moieties are optionally independently substituted on nitrogen and/or carbon atoms thereof with substituents selected from the group consisting of: H; $C_1$-$C_8$ alkyl; $C_6$-$C_{10}$ aryl; $C_7$-$C_{16}$ alkylaryl; $C_7$-$C_{16}$ arylalkyl; halo; amines; amidinates; guanidinates; and cyclopentadienyls, optionally substituted with $C_1$-$C_8$ alkyl, amines, or halo substituents; and
contacting the precursor vapor with the substrate under vapor deposition conditions effective for depositing cobalt on the substrate from the precursor vapor, wherein the vapor deposition conditions include temperature not exceeding 200° C., and wherein the substrate includes copper surface and dielectric material surface and wherein cobalt is deposited selectively on the copper surface relative to the dielectric material.

2. The process of claim 1, wherein the non-oxygen-containing cobalt precursor comprises a precursor selected from the group consisting of cobalt bis-diazadiene compounds whose diazadiene moieties are optionally independently substituted on nitrogen and/or carbon atoms thereof with substituents selected from the group consisting of: H; $C_1$-$C_8$ alkyl; $C_6$-$C_{10}$ aryl; $C_7$-$C_{16}$ alkylaryl; $C_7$-$C_{16}$ arylalkyl; halo; amines; amidinates; guanidinates; and cyclopentadienyls, optionally substituted with $C_1$-$C_8$ alkyl, amines, or halo substituents.

3. The process of claim 1, wherein the non-oxygen-containing cobalt precursor comprises a precursor selected from the group consisting of cobalt bis-diazadiene compounds whose diazadiene moieties are optionally independently substituted on nitrogen and/or carbon atoms thereof with substituents selected from the group consisting of: H; $C_1$-$C_8$ alkyl; $C_6$-$C_{10}$ aryl; $C_7$-$C_{16}$ alkylaryl; $C_7$-$C_{16}$ arylalkyl; halo; amines; amidinates; guanidinates; and cyclopentadienyls, optionally substituted with $C_1$-$C_8$ alkyl, amines, or halo substituents.

4. The process of claim 1, wherein the non-oxygen-containing cobalt precursor comprises:

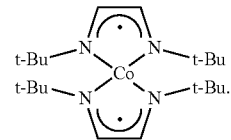

5. The process of claim 1, wherein the non-oxygen-containing cobalt precursor comprises a cobalt precursor of the formula {RNCHCHNR}$_2$Co, or {R'NCRCRNR'}$_2$Co, wherein each R and R' is independently selected from among $C_1$-$C_8$ alkyl.

6. The process of claim 1, wherein the precursor vapor is mixed with hydrogen for said contacting.

7. The process of claim 1, further comprising annealing the cobalt deposited on the substrate.

8. The process of claim 1, wherein the non-oxygen-containing cobalt precursor comprises a cobalt precursor with mono- or bis-substituted alkyl-1,3-diazabutadienyl ligands.

9. The process of claim 1, wherein the deposited cobalt forms an electrode.

10. The process of claim 1, wherein said vapor deposition conditions comprise a deposition pressure in a range of from 2 to 1200 torr.

11. The process of claim 1, further comprising annealing the cobalt deposited on the substrate by thermal annealing at temperature in a range of from 200° C. to 600° C.

12. The process of claim 1, wherein said contacting of the precursor vapor with the substrate is carried out for a period of time sufficient to deposit cobalt on the substrate at a thickness in a range of from 2 nm to 1000 nm.

13. The process of claim 1, wherein the cobalt deposited on the substrate has a resistivity in a range of from 7 to 48 μΩ-cm.

14. The process of claim 1, wherein the deposited cobalt fills a via of the substrate and is deposited over the copper surface in the via.

15. The process of claim 1, wherein the copper surface has one or more layers deposited thereon, and said cobalt is deposited on an outermost surface of said one or more layers.

16. The process of claim 1, wherein the vapor deposition conditions include temperature in a range of from 120° C. to 175° C.

* * * * *